(12) United States Patent
Chida et al.

(10) Patent No.: US 8,409,973 B2
(45) Date of Patent: Apr. 2, 2013

(54) SEPARATION APPARATUS, SEPARATION METHOD, AND METHOD FOR MANUFACTURING SEMICONDUCTOR ELEMENT

(75) Inventors: Akihiro Chida, Kanagawa (JP); Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 25 days.

(21) Appl. No.: 13/168,059

(22) Filed: Jun. 24, 2011

(65) Prior Publication Data

US 2011/0318906 A1     Dec. 29, 2011

(30) Foreign Application Priority Data

Jun. 25, 2010  (JP) .................................. 2010-145260

(51) Int. Cl.
*H01L 21/304* (2006.01)
(52) U.S. Cl. .................................. 438/478; 257/E21.237
(58) Field of Classification Search .................. 438/478; 257/E21.237
See application file for complete search history.

(56) References Cited

U.S. PATENT DOCUMENTS

| | | | | |
|---|---|---|---|---|
| 5,811,348 A * | 9/1998 | Matsushita et al. | ............ | 438/455 |
| 5,861,077 A * | 1/1999 | Kamijo et al. | ................ | 156/765 |
| 6,100,166 A * | 8/2000 | Sakaguchi et al. | ............ | 438/455 |
| 6,258,666 B1 * | 7/2001 | Mizutani et al. | ............... | 438/258 |
| 6,448,155 B1 * | 9/2002 | Iwasaki et al. | ................ | 438/464 |
| 7,459,726 B2 | 12/2008 | Kato et al. | | |
| 7,605,056 B2 | 10/2009 | Takahashi et al. | | |
| 7,875,531 B2 * | 1/2011 | Dross et al. | .................... | 438/458 |
| 8,038,839 B2 * | 10/2011 | Noda et al. | ..................... | 156/712 |
| 8,247,261 B2 * | 8/2012 | Bedell et al. | ..................... | 438/73 |
| 2001/0018949 A1 * | 9/2001 | Mizutani et al. | ............... | 156/233 |
| 2003/0032210 A1 | 2/2003 | Takayama et al. | | |
| 2007/0029554 A1 | 2/2007 | Nakamura et al. | | |
| 2007/0249140 A1 * | 10/2007 | Dross et al. | .................... | 438/458 |
| 2008/0132033 A1 | 6/2008 | Eguchi et al. | | |
| 2009/0239320 A1 | 9/2009 | Takayama et al. | | |
| 2010/0311250 A1 * | 12/2010 | Bedell et al. | ................... | 438/759 |
| 2011/0297771 A1 * | 12/2011 | Noda et al. | ....................... | 241/65 |

FOREIGN PATENT DOCUMENTS

| | | |
|---|---|---|
| JP | 2003-174153 | 6/2003 |
| JP | 2004-247405 | 9/2004 |
| JP | 2004-315358 | 11/2004 |
| JP | 2007-67381 | 3/2007 |
| JP | 2009-804 | 1/2009 |
| JP | 2009-6414 | 1/2009 |

* cited by examiner

*Primary Examiner* — Alexander Ghyka
*Assistant Examiner* — Stanetta Isaac
(74) *Attorney, Agent, or Firm* — Husch Blackwell LLP

(57) ABSTRACT

Objects are to reduce the number of steps in a process for separating a substrate and a semiconductor element, to provide a separation apparatus capable of reducing the number of steps, to suppress manufacturing cost by reducing the number of steps in a separation process, and to improve productivity in manufacturing semiconductor elements. A separation apparatus including a frame body, a porous body having a chamfered, rounded corner portion, a suction unit configured to create suction in the porous body and the frame body, and a jig which includes a unit adopted to press down part of an object to be separated and a unit adopted to lift another part of the object to be separated, and also a separation method and a method for manufacturing a semiconductor element by using the separation apparatus, are provided.

22 Claims, 22 Drawing Sheets

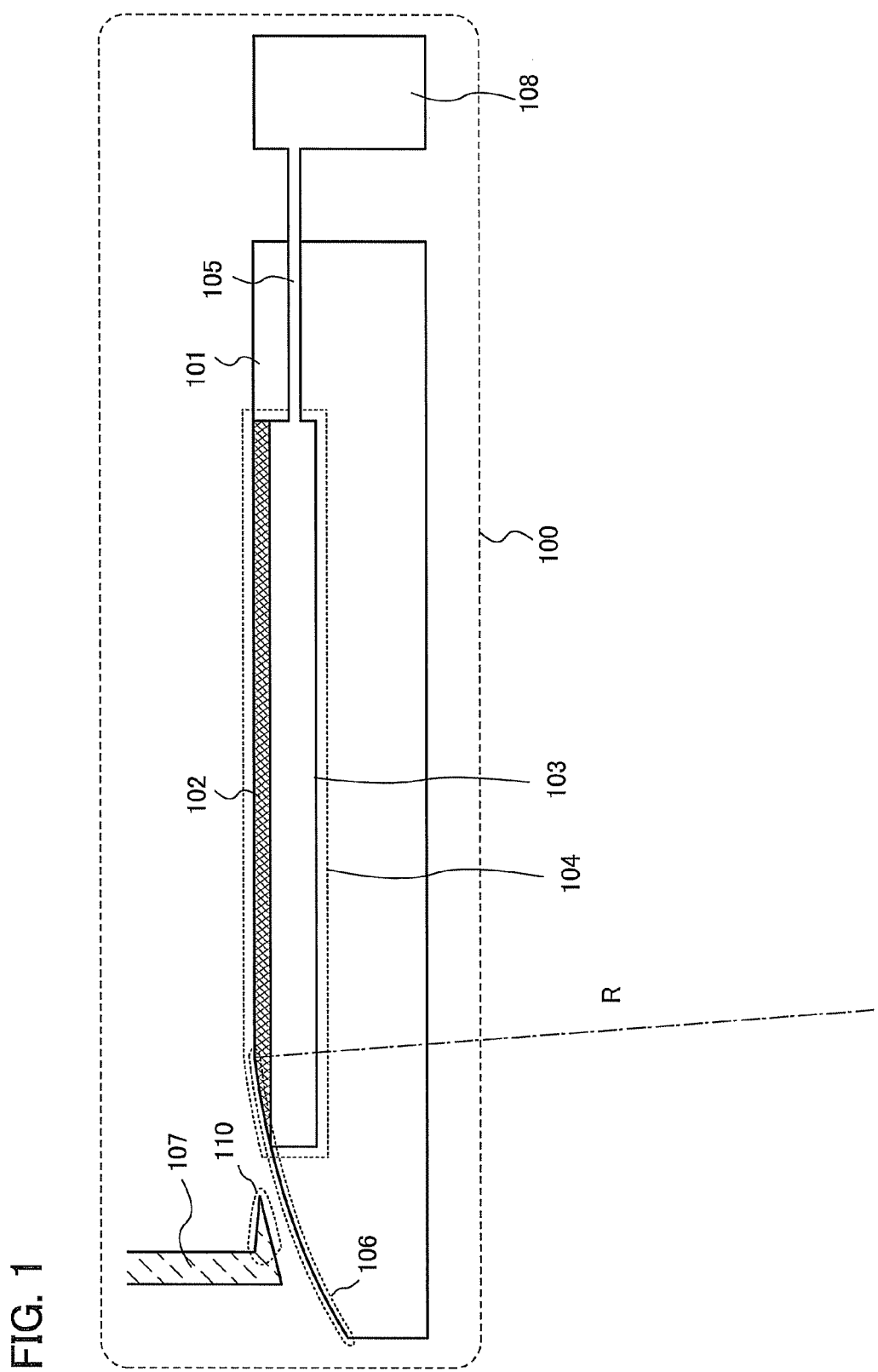

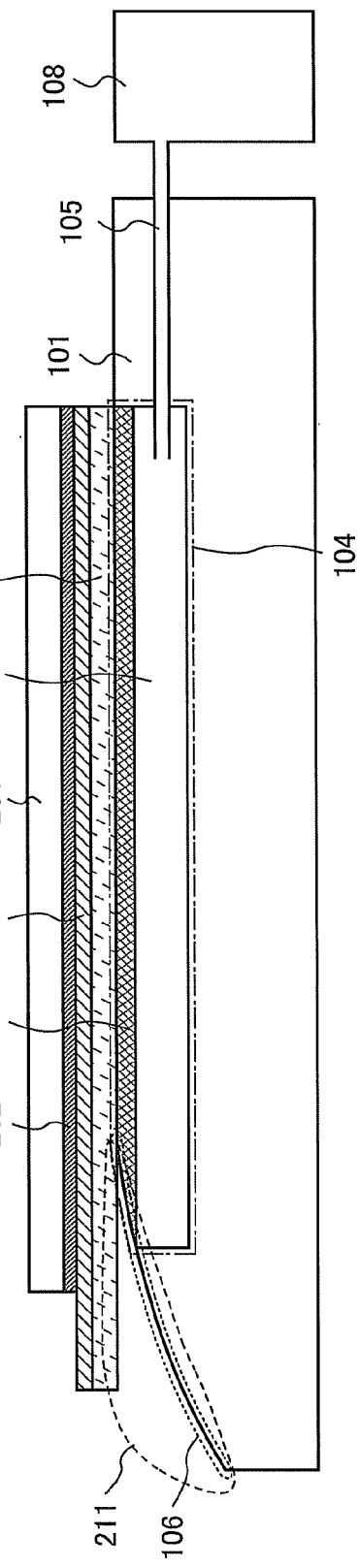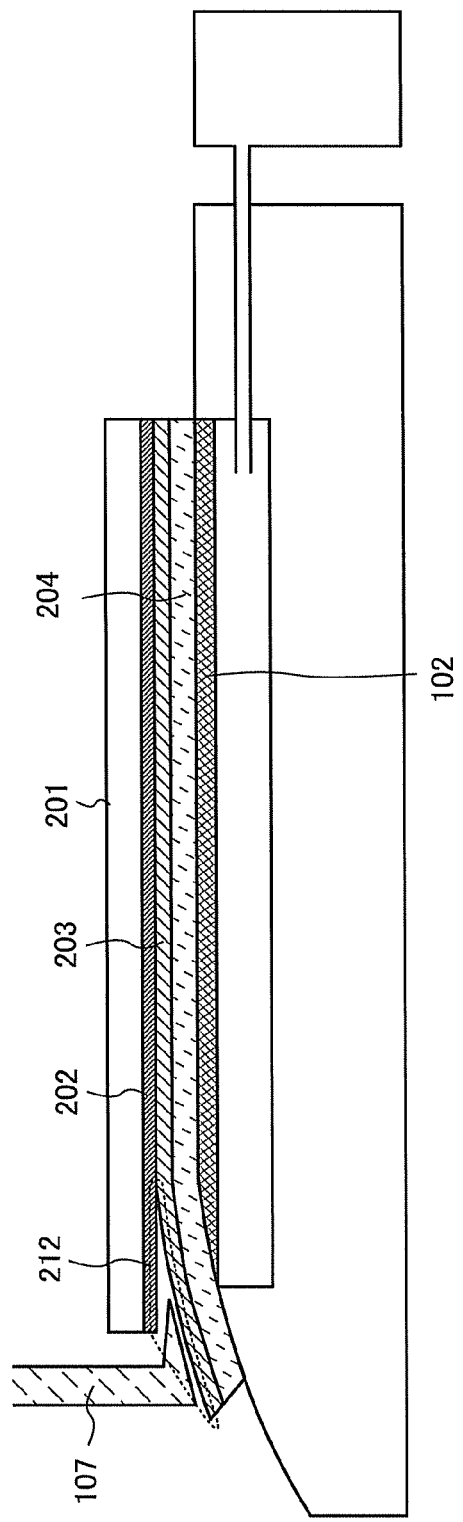

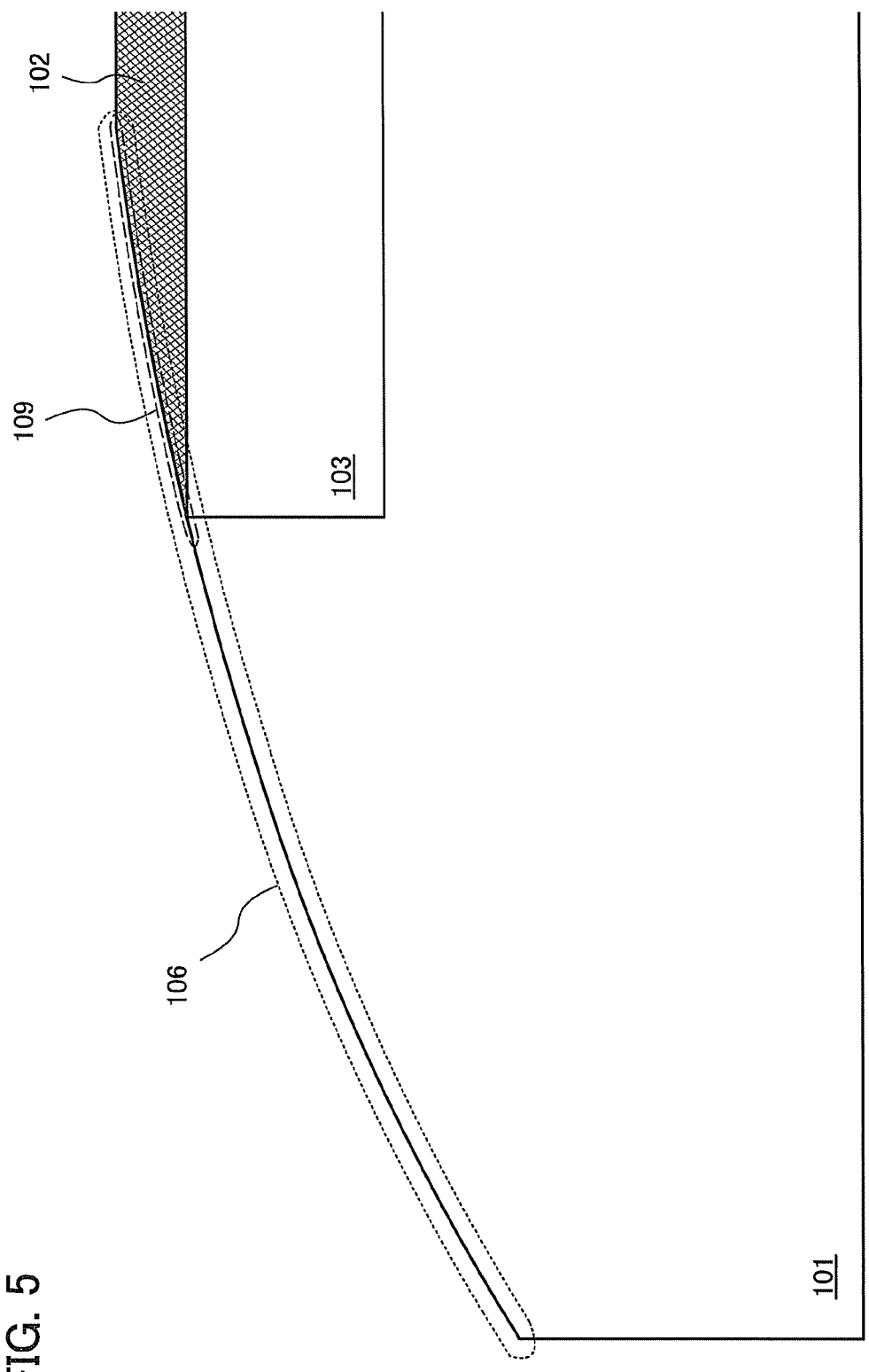

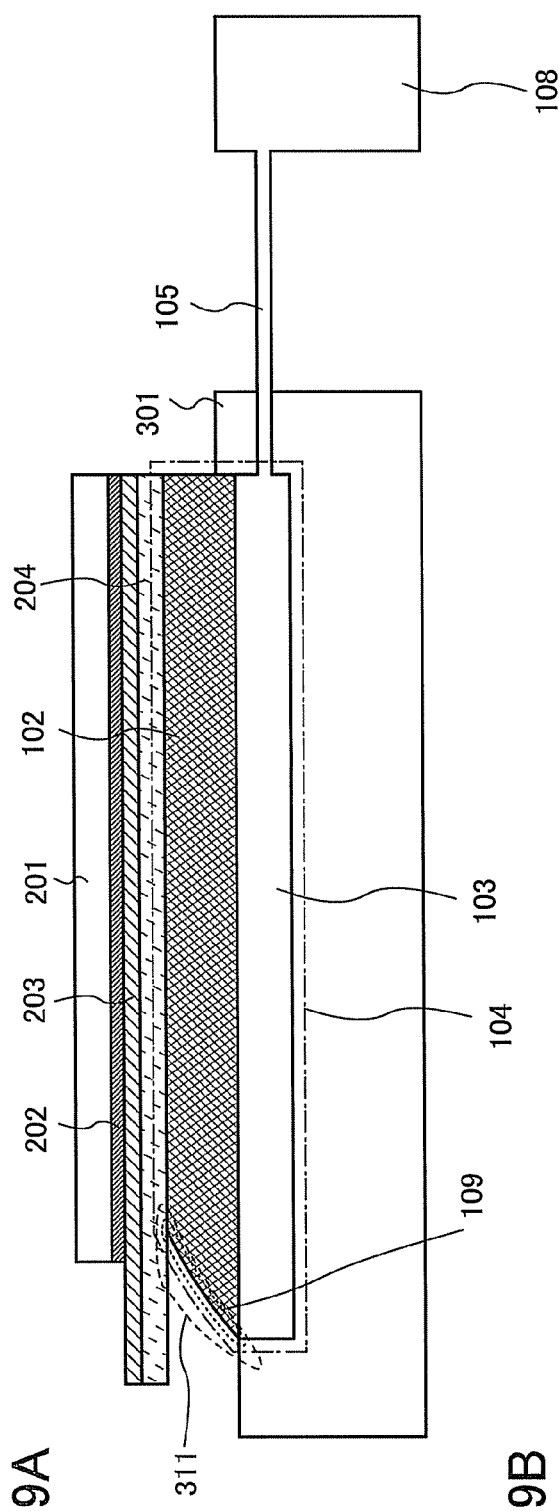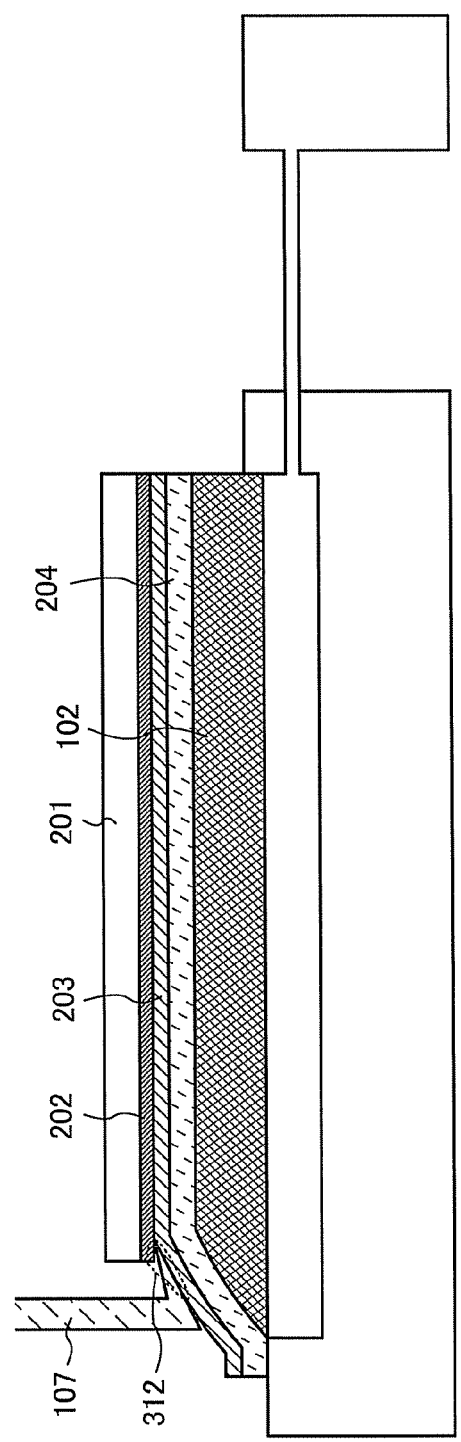

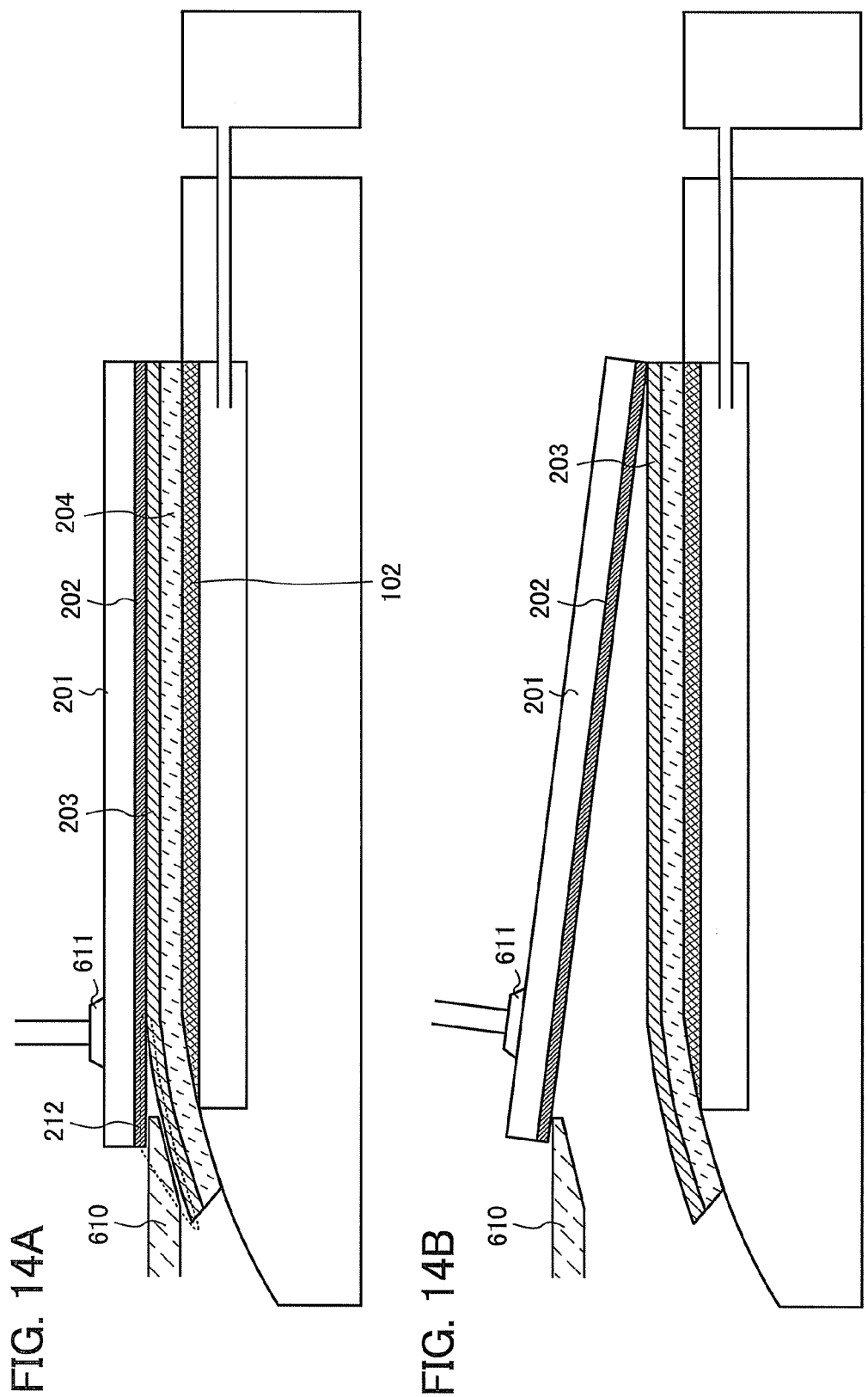

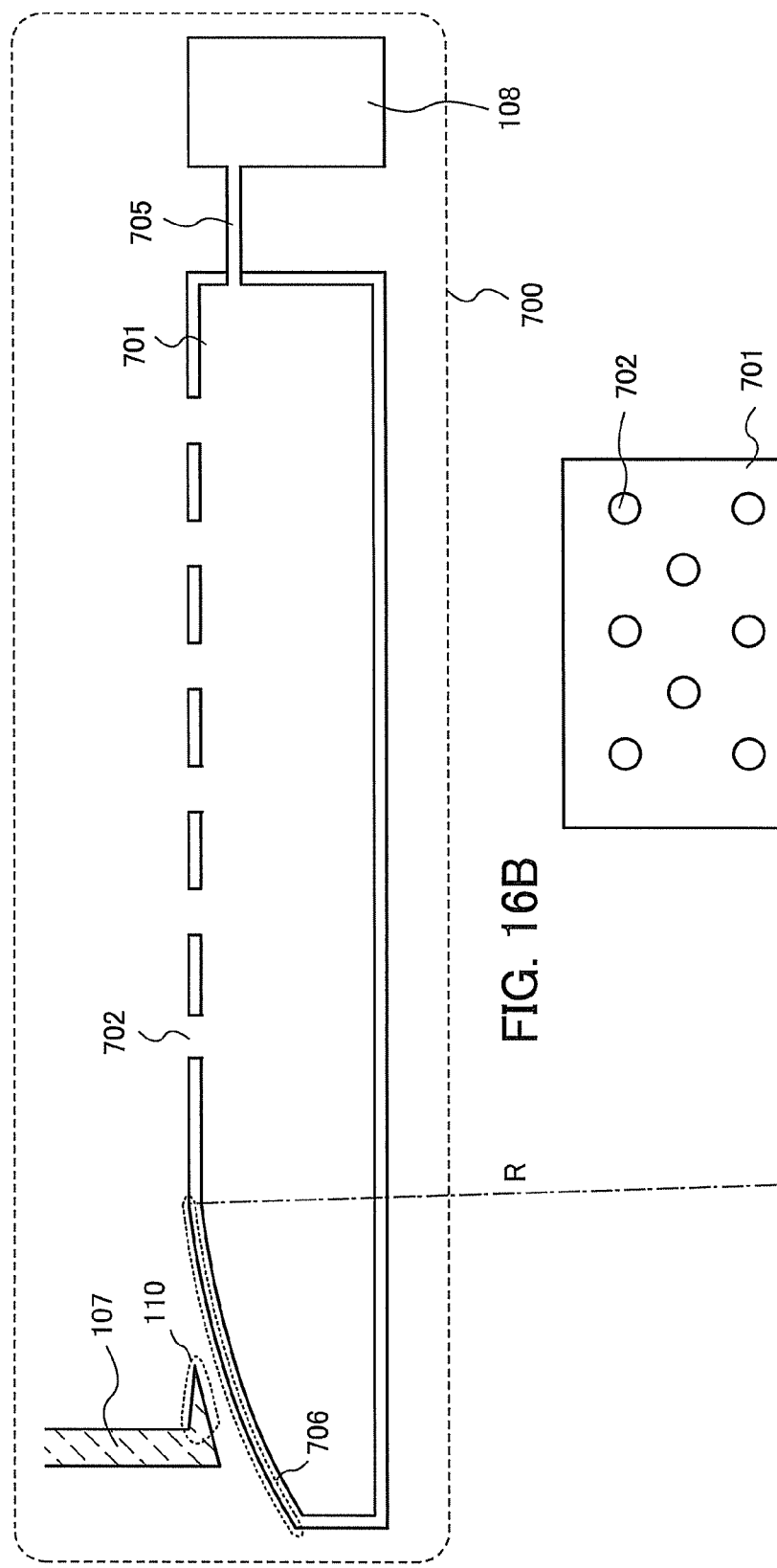

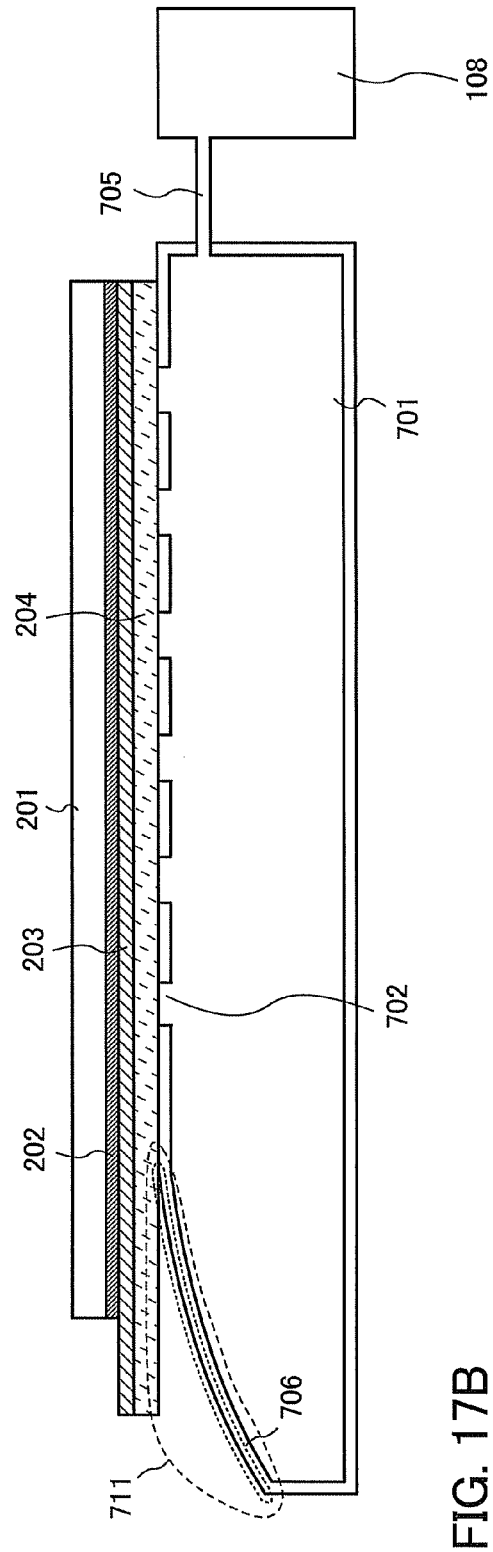
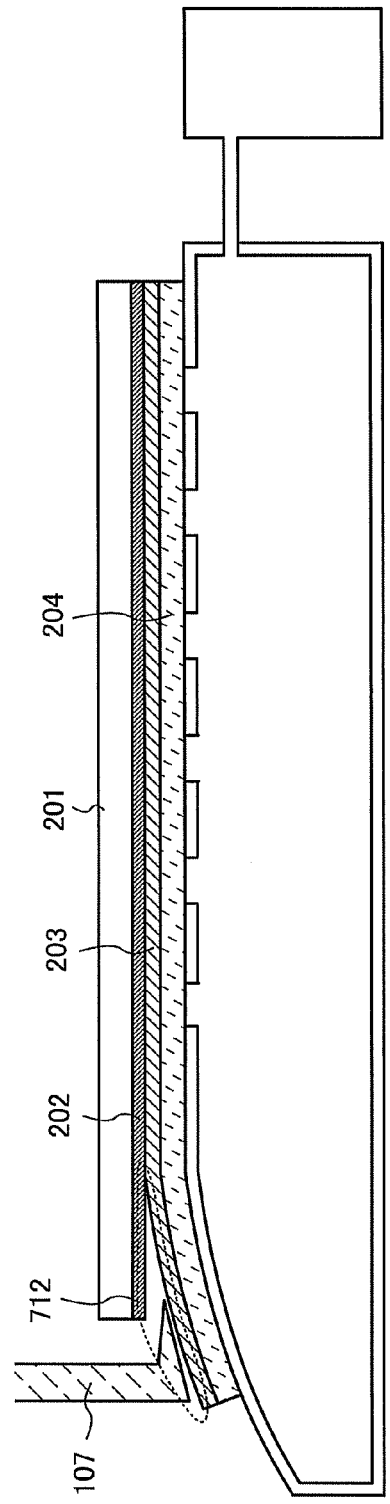

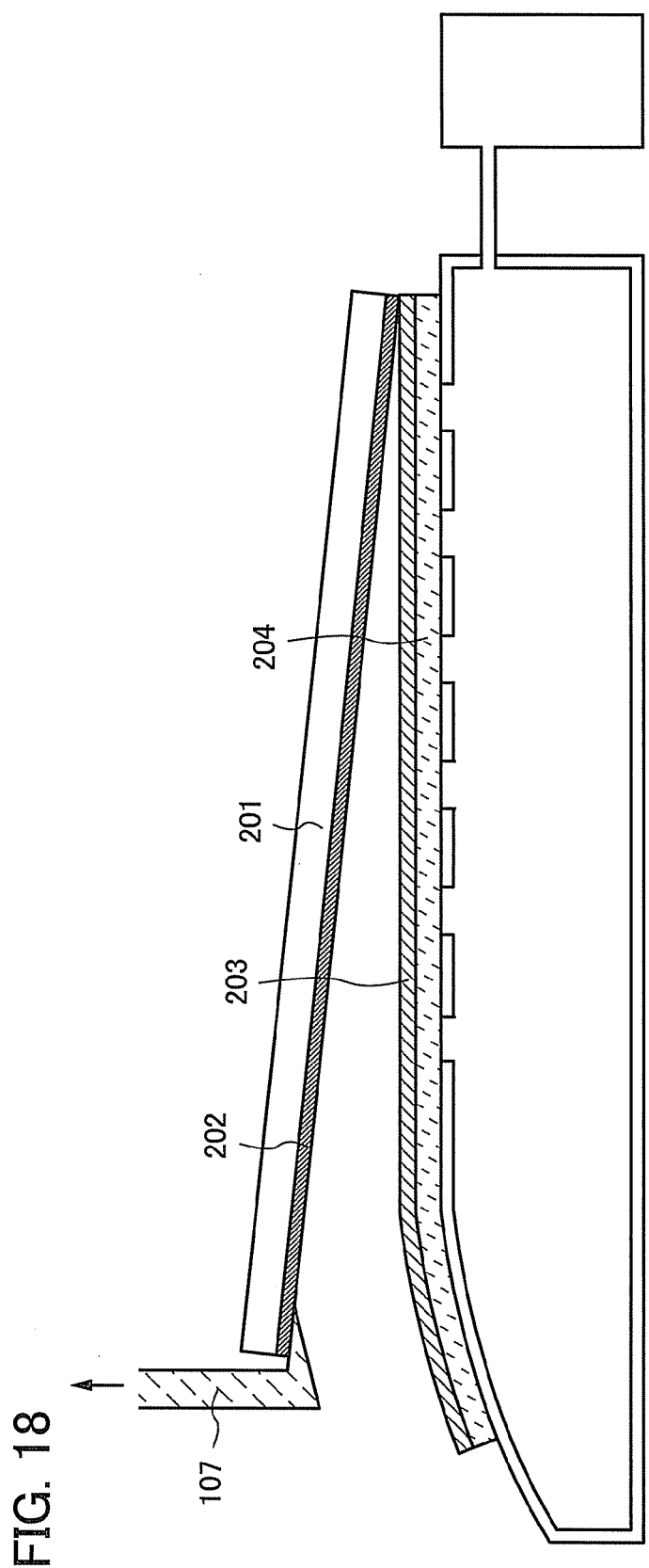

SEPARATION APPARATUS, SEPARATION METHOD, AND METHOD FOR MANUFACTURING SEMICONDUCTOR ELEMENT

BACKGROUND OF THE INVENTION

1. Field of the Invention

An embodiment of the invention disclosed herein relates to a separation apparatus, a separation method, and a method for manufacturing semiconductor elements.

2. Description of the Related Art

In recent years, attention has been drawn to a technique for forming semiconductor elements such as thin film transistors (TFTs) by using a semiconductor thin film formed over a substrate having an insulating surface. Thin film transistors are widely applied to electric devices such as an integrated circuit, an electro-optical device, a photoelectric conversion device, and a wireless communication device and are being urgently developed especially as switching elements for image display devices (see Patent Document 1, Patent Document 2, and Patent Document 3).

There is a variety of applications for such image display devices; among them, an application to portable devices has particularly attracted attention. Therefore, it has been attempted to form TFT elements over a flexible substrate, typically a flexible plastic film (see Patent Document 1, Patent Document 2, and Patent Document 3).

REFERENCES

[Patent Document 1] Japanese Published Patent Application No. 2003-174153
[Patent Document 2] Japanese Published Patent Application No. 2004-247405
[Patent Document 3] Japanese Published Patent Application No. 2007-67381

SUMMARY OF THE INVENTION

A problem of a process for separating a substrate and a semiconductor element from each other by a conventional technique is a large number of steps.

For example, in Patent Document 2, a separation layer including a metal film and an oxide film is stacked over a first substrate, and a semiconductor element layer is formed over the separation layer. A second substrate is attached to the semiconductor element layer, and a third substrate is attached to the first substrate.

Then, the metal film and the oxide film are physically torn apart from each other; thus, the metal film and the oxide film are separated from each other. Accordingly, the semiconductor element layer on the second substrate side and the first substrate and the metal film on the third substrate side are separated from each other.

Then, the semiconductor element layer is attached to an element substrate. After that, the second substrate is separated from the semiconductor element layer. In the above manner, the semiconductor element layer formed over the element substrate is obtained.

As described above, a conventional separation process includes steps of attaching a support substrate to and separating the support substrate from each of the first substrate and the semiconductor element layer. For this reason, the total number of steps is large.

In view of the above problem, it is an object of one embodiment of the disclosed invention to reduce the number of steps in a process for separating a substrate and a semiconductor element from each other, as compared to a conventional process.

It is an object of one embodiment of the disclosed invention to provide a separation apparatus capable of reducing the number of steps as compared to a conventional apparatus.

It is an object of one embodiment of the disclosed invention to reduce manufacturing cost by reducing the number of steps in a separation process.

It is an object of one embodiment of the disclosed invention to improve productivity in manufacturing semiconductor elements.

In one disclosed embodiment, in a separation process, a separation apparatus including a stage provided with a porous body is used, and a semiconductor element layer or a substrate over which a separation layer and a semiconductor element layer are formed first (hereinafter referred to as a "holding substrate") is held by suction. Thus, the number of substrates to be attached to the semiconductor element layer and the holding substrate (hereinafter referred to as "support substrates") is reduced. A reduction in the number of support substrates realizes a reduction in the number of steps of attaching and separating the support substrates. Accordingly, the number of manufacturing steps can be reduced as compared to a conventional technique. By reducing the number of manufacturing steps, manufacturing cost can also be reduced.

In one disclosed embodiment, one corner portion of the porous body, or corner portions of the porous body and the stage, is chamfered so as to be rounded. In the separation process, a corner portion of the holding substrate is removed and a portion of the semiconductor element layer is exposed. A cut is made in an end portion of the holding substrate, and the end portion of the holding substrate is lifted. The separation layer and a layer provided above and in contact with the separation layer have low adhesion. In addition, the separation layer and a layer provided below and in contact with the separation layer also have low adhesion. Therefore, by lifting the end portion of the holding substrate having the cut, only the end portion of the holding substrate can be removed while the semiconductor element layer is left remaining.

With a jig which can be moved up and down, the exposed region of the semiconductor element layer is pressed down to the stage side. By pressing down the exposed region of the semiconductor element layer, the semiconductor element layer is separated due to low adhesion to the separation layer and the holding substrate provided thereover.

By applying a downward force to the exposed region of the semiconductor element layer, only the semiconductor element layer can be easily separated with a weak force.

By being further pressed down with the jig, the semiconductor element layer is curved along the portion of the stage with a curvature radius.

Accordingly, a space where the semiconductor element layer is separated from the separation layer is provided between the semiconductor element layer and the holding substrate.

By using the jig, the holding substrate is lifted up away from the space where the semiconductor element layer is separated from the separation layer. At that time, when the holding substrate is lifted so as to be curved, a region to be separated per unit time has a linear shape or a band-like shape. On the other hand, when the holding substrate is lifted vertically, a region to be separated per unit time has a large area. Thus, by lifting the holding substrate so as to be curved, the semiconductor element layer can be separated with a weaker force than in the case of lifting the holding substrate vertically.

As described above, when the semiconductor element layer and the holding substrate are separated by using the stage according to one embodiment of the disclosed invention, the semiconductor element layer and the holding substrate can be separated easily. Because the semiconductor element layer and the holding substrate can be separated easily, productivity in manufacturing semiconductor elements can be improved.

One embodiment of the disclosed invention relates to a separation apparatus. A feature of the separation apparatus is to include a frame body, a porous body provided over the frame body and having a chamfered, rounded corner portion, and a suction unit configured to create suction in the porous body and the frame body. A feature of the separation apparatus is to include a jig which includes a unit adopted to press down part of an object to be separated and a unit adopted to lift another part of the object to be separated.

One embodiment of the disclosed invention relates to a separation method. A feature of the separation method is as follows. A separation layer and a semiconductor element layer are stacked over a holding substrate. A portion of the semiconductor element layer is exposed by removing a portion of the holding substrate and a portion of the separation layer. A stack of the semiconductor element layer, the separation layer, and the holding substrate is held by suction over a porous body having a chamfered, rounded corner portion. By pressing down the exposed portion of the semiconductor element layer, the exposed portion of the semiconductor element layer is curved along the chamfered, rounded corner portion of the porous body. By curving the portion of the semiconductor element layer, a space is provided between the semiconductor element layer and the holding substrate. By lifting the holding substrate, separation of the semiconductor element layer and the holding substrate proceeds from the space through the separation layer.

One embodiment of the disclosed invention relates to a method for manufacturing a semiconductor element. A feature of the method for manufacturing a semiconductor element is as follows. A separation layer is formed over a holding substrate. A semiconductor element layer including a thin film transistor is formed over the separation layer. A portion of the semiconductor element layer is exposed by removing a portion of the holding substrate and a portion of the separation layer. A stack of the semiconductor element layer, the separation layer, and the holding substrate is held by suction over a porous body having a chamfered, rounded corner portion. By pressing down the exposed portion of the semiconductor element layer, the exposed portion of the semiconductor element layer is curved along the chamfered, rounded corner portion of the porous body. By curving the portion of the semiconductor element layer, a space is provided between the semiconductor element layer and the holding substrate. By lifting the holding substrate, separation of the semiconductor element layer and the holding substrate proceeds from the space through the separation layer.

One embodiment of the disclosed invention relates to a separation method. A feature of the separation method is as follows. A separation layer and a semiconductor element layer are stacked over a holding substrate. A portion of the semiconductor element layer is exposed by removing a portion of the holding substrate and a portion of the separation layer. A stack of the semiconductor element layer, the separation layer, and the holding substrate is held by suction over a stage having a chamfered, rounded corner portion. By pressing down the exposed portion of the semiconductor element layer, the exposed portion of the semiconductor element layer is curved along the chamfered, rounded corner portion of the stage. By curving the portion of the semiconductor element layer, a space is provided between the semiconductor element layer and the holding substrate. By lifting the holding substrate, separation of the semiconductor element layer and the holding substrate proceeds from the space through the separation layer.

One embodiment of the disclosed invention relates to a method for manufacturing a semiconductor element. A feature of the method for manufacturing a semiconductor element is as follows. A separation layer is formed over a holding substrate. A semiconductor element layer including a thin film transistor is formed over the separation layer. A portion of the semiconductor element layer is exposed by removing a portion of the holding substrate and a portion of the separation layer. A stack of the semiconductor element layer, the separation layer, and the holding substrate is held by suction over a stage having a chamfered, rounded corner portion. By pressing down the exposed portion of the semiconductor element layer, the exposed portion of the semiconductor element layer is curved along the chamfered, rounded corner portion of the stage. By curving the portion of the semiconductor element layer, a space is provided between the semiconductor element layer and the holding substrate. By lifting the holding substrate, separation of the semiconductor element layer and the holding substrate proceeds from the space through the separation layer.

A feature of one embodiment of the disclosed invention is that the porous body includes one of a ceramic having a porous structure, a metal having a porous structure, and a resin having a porous structure.

A feature of one embodiment of the disclosed invention is that a strength-retaining layer is formed in contact with the semiconductor element layer.

A feature of one embodiment of the disclosed invention is that the strength-retaining layer is a UV detachable film or a water-soluble resin.

According to one embodiment of the disclosed invention, the number of steps in the process for separating a substrate and a semiconductor element from each other can be reduced as compared to a conventional process.

According to one embodiment of the disclosed invention, a separation apparatus capable of reducing the number of steps as compared to a conventional apparatus can be provided.

According to one embodiment of the disclosed invention, by reducing the number of steps in a separation process, manufacturing cost can be reduced.

According to one embodiment of the disclosed invention, productivity in manufacturing semiconductor elements can be improved.

BRIEF DESCRIPTION OF THE DRAWINGS

FIG. 1 is a cross-sectional view of a separation apparatus.
FIGS. 3A and 3B are cross-sectional views illustrating a method for manufacturing a semiconductor element.
FIG. 5 is a cross-sectional view of a separation apparatus.
FIGS. 9A and 9B are cross-sectional views illustrating a method for manufacturing a semiconductor element.

FIGS. 14A and 14B are cross-sectional views illustrating a method for manufacturing a semiconductor element.

FIGS. 16A and 16B are a cross-sectional view and a top view of a separation apparatus.

FIGS. 17A and 17B are cross-sectional views illustrating a method for manufacturing a semiconductor element.

FIG. 18 is a cross-sectional view illustrating a method for manufacturing a semiconductor element.

DETAILED DESCRIPTION OF THE INVENTION

Figure 2A:
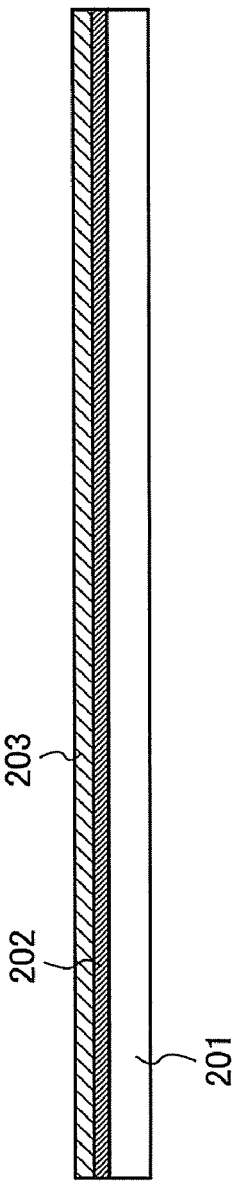
FIGS. 2A to 2C are cross-sectional views illustrating a method for manufacturing a semiconductor element.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the invention should not be construed as being limited to the description in the embodiments. Note that in the accompanying drawings, the same portions or portions having similar functions are denoted by the same reference numerals, and repetitive description thereof is omitted.

<Separation Apparatus>

FIG. 1 is a diagram illustrating a structure of a separation apparatus 100 of this embodiment, and FIG. 5 is a partial enlarged view of the separation apparatus 100. The separation apparatus 100 includes a stage 101 having a chamfered, rounded corner portion 106, a jig 107 having a projecting portion 110, and a suction unit 108. The stage 101 is provided with a base 104 which includes a porous body 102 having a chamfered, rounded corner portion 109 and a frame body 103 surrounding the porous body 102. The porous body 102 is provided over the frame body 103 and holds an object by suction. The porous body 102 is formed using a porous material such as a ceramic having a porous structure, a metal having a porous structure, or a resin having a porous structure and has air permeability. The porous body 102 has a plurality of air holes each having a diameter of more than or equal to 0.1 μm and less than 10 μm.

The frame body 103 is connected to a connecting pipe 105, and the connecting pipe 105 is connected to the suction unit 108. The suction unit 108 creates suction in the base 104 (the porous body 102 and the frame body 103) through the connecting pipe 105. Thus, an object over the porous body 102 is held by suction.

In a separation process to be described below, a semiconductor element layer 203 is curved with the jig 107 along the chamfered, rounded corner portion 106 of the stage 101 and the chamfered, rounded corner portion 109 of the porous body 102. Note that the entire corner portion 106 does not necessarily need to have a uniform curvature radius. The corner portion 106 may have a curvature radius sufficient to provide a space 212 between the semiconductor element layer 203 and a holding substrate 201 by separating the semiconductor element layer 203 from a separation layer 202 and to insert the projecting portion 110 of the jig 107 in the space 212, in the separation process described below. It is needless to say that the entire corner portion 106 may have a uniform and continuous curvature radius.

Therefore, the curvature radius R of the corner portion 106 of the stage 101 and the corner portion 109 of the porous body 102 is set such that the semiconductor element layer 203 can be prevented from being damaged. The value of the curvature radius R will be described later.

In addition, in the separation process to be described below, the holding substrate 201 is lifted by lifting the jig 107 while the projecting portion 110 of the jig 107 is in contact with the holding substrate 201. Accordingly, the holding substrate 201 and the semiconductor element layer 203 are separated from each other through the separation layer 202. Note that a driving apparatus for driving the jig 107 may be provided to automatically drive the jig 107.

Figure 19:
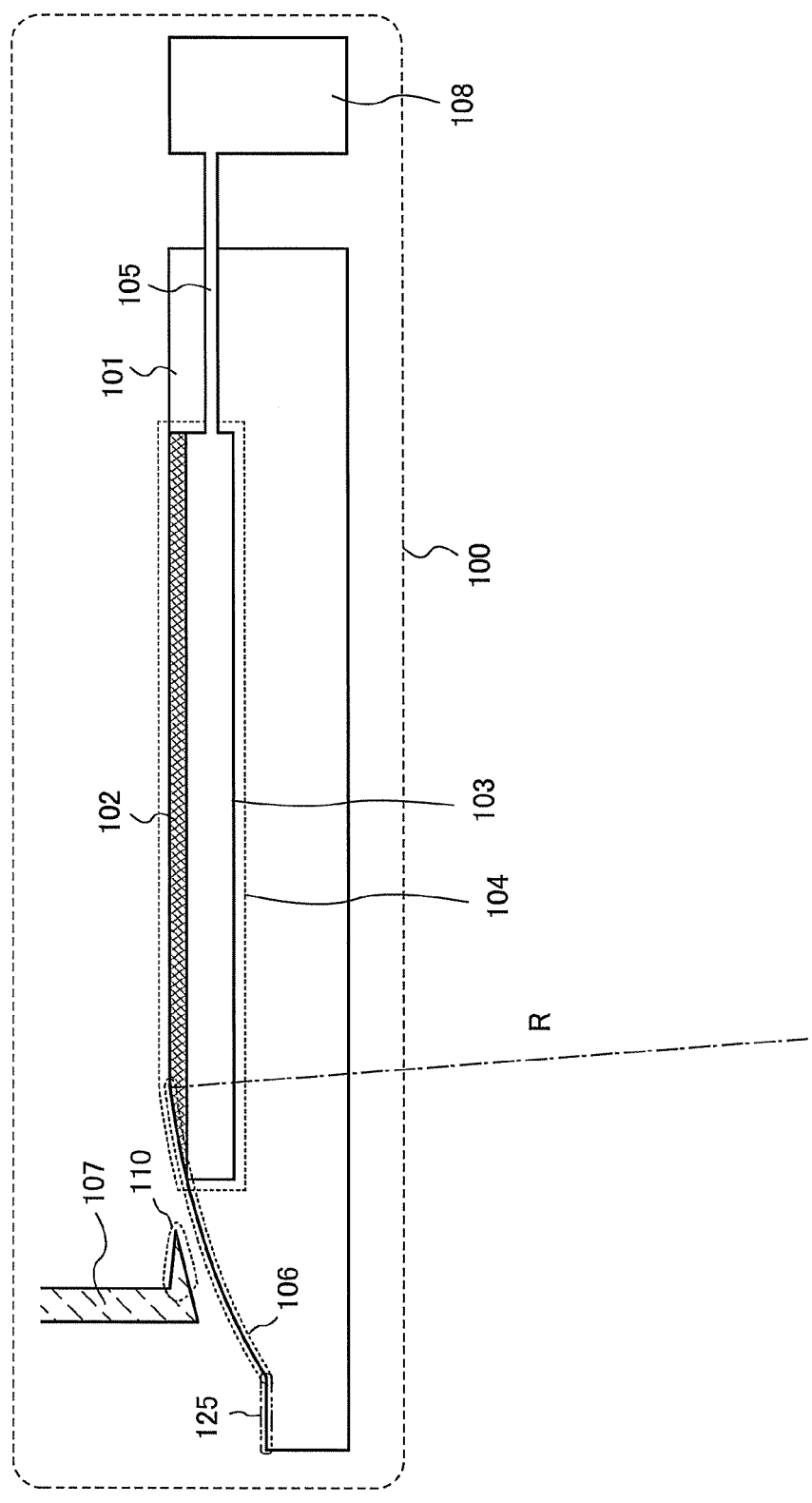
FIG. 19 is a cross-sectional view of a separation apparatus.

Note that in FIG. 1 and FIG. 5, the chamfered, rounded corner portion 106 is at an end portion of the stage 101. However, the end portion of the stage 101 does not necessarily need to be chamfered so as to be rounded. FIG. 19 illustrates an example in which an end portion of the stage 101 has the chamfered, rounded corner portion 106 and a flat portion 125.

Even in the case where the end portion of the stage 101 has the flat portion 125, there is no problem with the separation process because the chamfered, rounded corner portion 106 is provided. Due to the presence of the chamfered, rounded corner portion 106, the space 212 is provided between the semiconductor element layer 203 and the holding substrate 201 in the separation process to be described below. It is preferable to provide the chamfered, rounded corner portion 106 because the jig 107 can be inserted in the space 212.

By using the separation apparatus of this embodiment, the number of steps in a separation process can be reduced as compared to a conventional apparatus. In addition, because the number of steps in a separation process can be reduced, manufacturing cost can be reduced. Furthermore, productivity in manufacturing semiconductor elements can be improved.

<Structure of Stage>

A specific value of a curvature radius R will be described with reference to FIGS. 11A and 11B and FIGS. 12A and 12B.

The semiconductor element layer 203 is curved along the chamfered, rounded corner portions of the stage 101 and the porous body 102 in the separation process. Damage to the semiconductor element layer 203 at that time may cause a decrease in the rate at which semiconductor elements can be produced.

Thus, an experiment was conducted to determine the value of the curvature radius R of the corner portions.

Figure 11A:
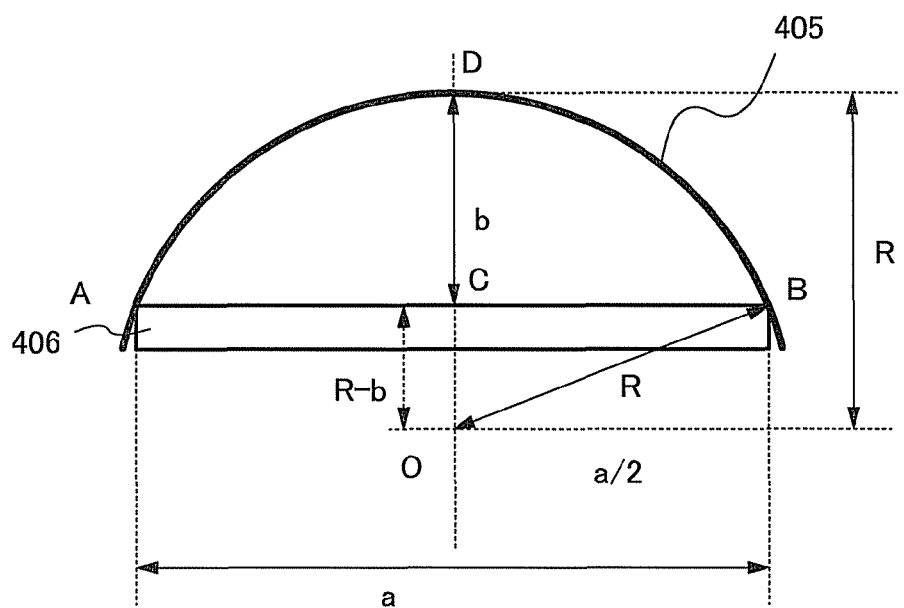
FIGS. 11A and 11B are diagrams illustrating a method for obtaining a curvature radius R.
Figure 11B:
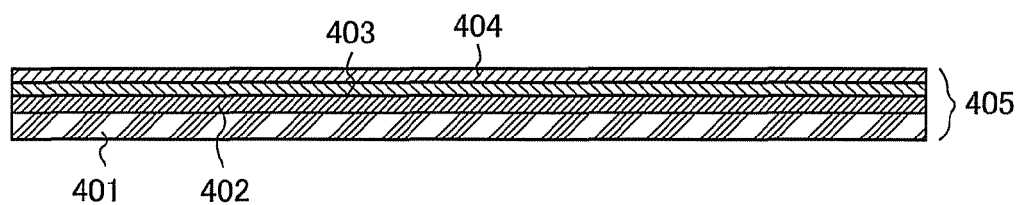

FIG. 11B illustrates a structure of a substrate 405. The substrate 405 includes a UV detachable film 401, a water-soluble resin 402, a tungsten film 403, and a silicon oxide film 404. The UV detachable film 401 and the water-soluble resin 402 correspond to a strength-retaining layer 204 mentioned above. The tungsten film 403 and the silicon oxide film 404 correspond to the separation layer 202.

As the UV detachable film 401, UV detachable tape "UDT-1025MC" (manufactured by Toyo Adtec Co., Ltd.) (300 μm thick) including polyethylene terephthalate was used. As the water-soluble resin 402, an acrylic-based resin "Aronix (registered trademark) VL-WSHL10" (manufactured by Toagosei Co., Ltd.) (30 µm thick) was used. The tungsten film 403 was formed by a sputtering method at a thickness of 50 nm, and the silicon oxide film 404 was formed by a sputtering method at a thickness of 200 nm.

The substrate 405 was attached to a board 406 having a width AB with a length a, and while being attached to the board 406, the substrate 405 was curved until a crack (damage) was caused in the substrate 405. The length b, which is a distance CD from a surface C of the board 406 to a highest point D of the curved substrate 405, was measured. Assuming that the curved substrate 405 was an arc with center O, the curvature radius R which is the length OB of one side of a right triangle OBC was calculated.

The width AB of the board 406 was 300 mm, and the distance b from the surface C of the board 406 to the highest point D of the substrate 405 was 45 mm. As a result, the curvature radius R which was the length OB of one side of the right triangle OBC was 27.25 cm.

From the above result, the curvature radius R of the stage 101 and the porous body 102 is preferably 27 cm or more, more preferably 27.5 cm or more. The curvature radius R of the stage 101 and the porous body 102 is further preferably 28 cm or more because there is almost no possibility that a crack would be caused. If the curvature radius R is small, when the strength-retaining layer 204 is curved, the semiconductor element layer 203 provided in contact with the strength-retaining layer 204 may be damaged.

Figure 12A:
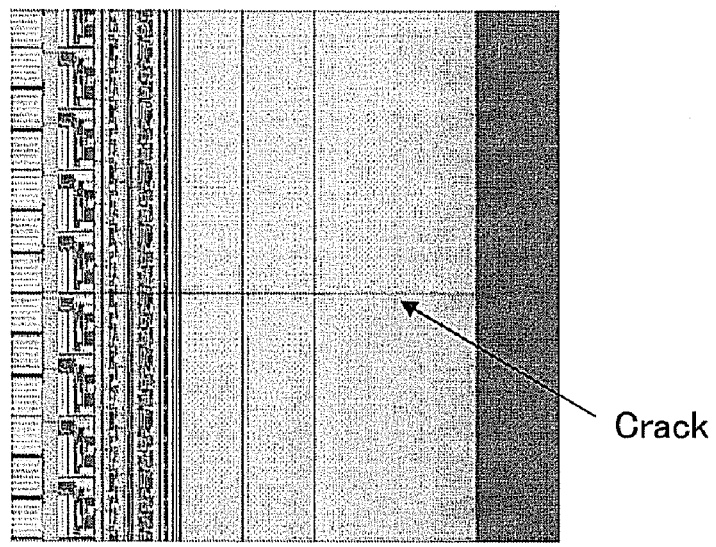
FIGS. 12A and 12B are photographs of a damaged semiconductor element layer.
Figure 12B:
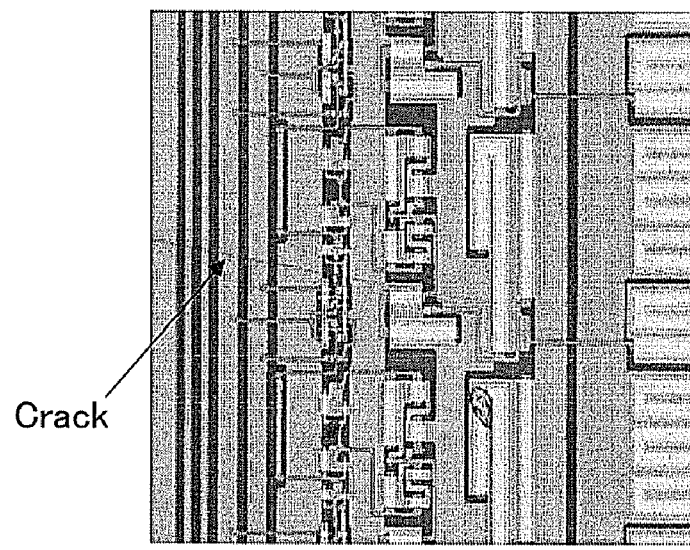

FIGS. 12A and 12B are photographs each showing a state in which the strength-retaining layer 204 and the semiconductor element layer 203 are damaged when the curvature radius R is 27.25 cm.

As shown in FIGS. 12A and 12B, it is found that an inappropriate value of the curvature radius R causes a crack in the semiconductor element layer 203.

<Separation Method and Method for Manufacturing Semiconductor Element Layer>

A separation method and a method for manufacturing a semiconductor element layer of this embodiment will be described below.

First, a holding substrate 201 is prepared. A separation layer 202 and a semiconductor element layer 203 are formed over the holding substrate 201 (see FIG. 2A).

As the holding substrate 201, a quartz substrate, a semiconductor substrate, a glass substrate, a metal substrate, or the like may be employed.

As the separation layer 202, a single metal layer or a stack of the metal layer and an oxide film thereof is formed by a plasma CVD method, a sputtering method, or the like. The metal layer includes at least one metal element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir). In this embodiment, a tungsten film is formed as the separation layer 202.

In a separation process to be described below, separation is carried out utilizing low adhesion of the separation layer 202 and a layer provided below and in contact with the separation layer 202 (in this embodiment, the holding substrate 201) and low adhesion of the separation layer 202 and a layer provided above and in contact with the separation layer 202 (in this embodiment, the semiconductor element layer 203, more specifically, an insulating film 112 to be described below).

In some cases, separation may occur from inside the separation layer 202; thus, the separation process can be carried out utilizing separation from inside the separation layer 202. In the case where a stack of a metal layer and an oxide film thereof is used as the separation layer 202, separation is carried out utilizing low adhesion between the metal layer and the oxide film thereof. Alternatively, the separation process can be carried out utilizing the fragility of the metal oxide film and the occurrence of separation from inside the metal oxide film.

Even in the case where a single metal layer is used as the separation layer 202, when an insulating film containing oxygen is formed on the metal layer, a metal oxide film is formed at the interface between the metal layer and the insulating film. Such a metal oxide film is formed by movement of oxygen from the insulating film containing oxygen to the metal layer by a heating step in the process for forming a thin film transistor 113 to be described below. When a metal oxide film is formed at the interface between the metal layer and the insulating film as described above, separation occurs at the interface between the metal layer and the metal oxide film or from inside the metal oxide film, and this can be utilized to carry out the separation process.

In this embodiment, a layer including a thin film transistor (TFT) is formed as the semiconductor element layer 203.

Figure 6A:
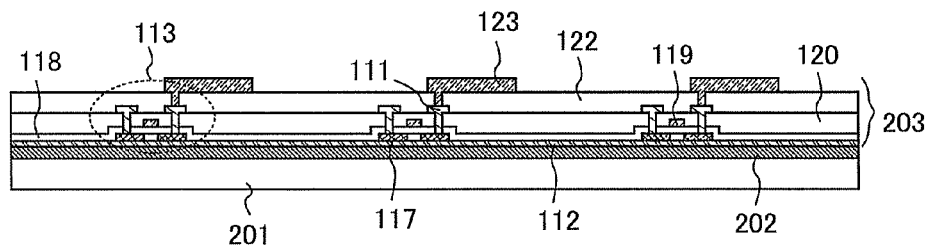
FIGS. 6A to 6E are cross-sectional views illustrating a method for manufacturing a semiconductor element.

An example of a structure of the semiconductor element layer 203 is illustrated in FIG. 6A. The semiconductor element layer 203 illustrated in FIG. 6A includes the insulating film 112, the thin film transistor 113 formed over the insulating film 112, an insulating film 122 covering the thin film transistor 113, and an electrode 123 formed over the insulating film 122.

The insulating film 112 serves as a base film. The insulating film 112 is formed using silicon oxide, silicon nitride, silicon oxide containing nitrogen, silicon nitride containing oxygen, or the like by a plasma CVD method, a sputtering method, or the like.

The thin film transistor 113 illustrated in FIG. 6A includes an island-shaped semiconductor film 117 including a source region, a drain region, and a channel formation region, a gate insulating film 118 over the island-shaped semiconductor film 117, a gate electrode 119 over the gate insulating film 118, an insulating film 120 over the gate insulating film 118 and the gate electrode 119, and electrodes 111 formed over the insulating film 120 and electrically connected to the source region and the drain region.

Note that the structure of the thin film transistor 113 is not limited to the one illustrated in FIG. 6A, and a thin film transistor having a structure other than the structure illustrated in FIG. 6A may be employed. For example, the thin film transistor 113 may have a structure of a known thin film transistor, such as a top-gate thin film transistor which includes sidewalls on opposite sides of the gate electrode 119 and includes LDD regions (low-concentration impurity regions), a bottom-gate thin film transistor, or a thin film transistor having a silicide region.

The insulating film 122 is formed over the thin film transistor 113. The insulating film 122 is formed by a known method, using an inorganic material such as a silicon oxide film, a silicon nitride film, a silicon oxynitride film, or a silicon nitride oxide film; an organic material such as polyimide, polyamide, benzocyclobutene, acrylic, or epoxy; siloxane; or the like. The insulating film 122 is formed with a single layer or a stacked layer using the above material. Note that in this specification, the silicon oxynitride film and the silicon nitride oxide film differ from each other in that the content of oxygen in the former is higher than that of nitrogen and the content of nitrogen in the latter is higher than that of oxygen.

The electrode 123 electrically connected to the electrode 111 of the thin film transistor 113 is formed over the insulating film 122. The electrode 123 is formed using a metal film or the like. In this embodiment, a titanium nitride film is formed as the electrode 123 by a sputtering method.

Figure 2B:
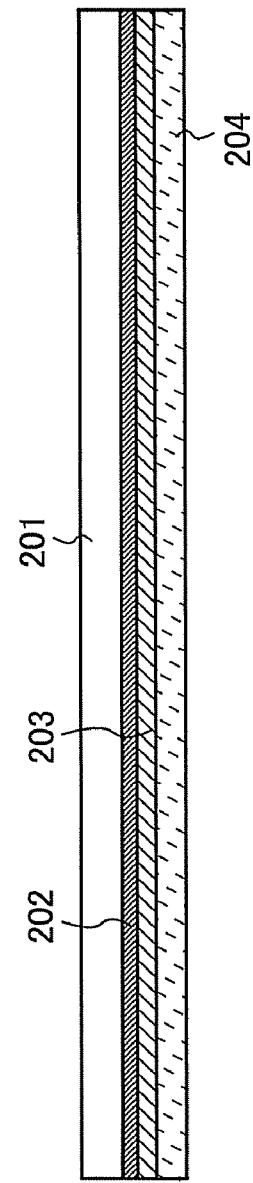
Figure 6C:
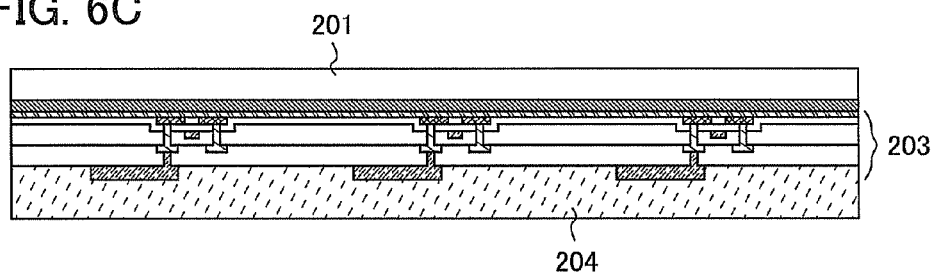
Figure 6B:
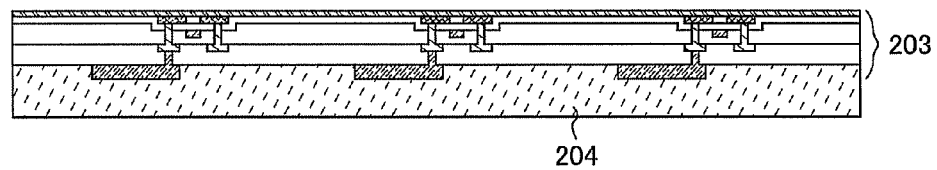

The strength-retaining layer 204 is provided in contact with the semiconductor element layer 203 (see FIG. 2B and FIG. 6B). The strength-retaining layer 204 is separated from the semiconductor element layer 203 in a later step; therefore, a detachable resin layer such as a UV (ultraviolet) detachable film or a water-soluble resin is used. A stack of the UV (ultraviolet) detachable film and the water-soluble resin may be used as the strength-retaining layer 204. The strength-retaining layer 204 functions to protect the semiconductor element layer 203 in the separation process. Note that the strength-retaining layer 204 is not necessarily provided in the case where the semiconductor element layer 203 is strong enough to be undamaged in the separation process. Note that a stack of the holding substrate 201, the separation layer 202, the semiconductor element layer 203, and the strength-retaining layer 204 is a separation target object and can therefore be referred to as an object to be separated.

Figure 2C:
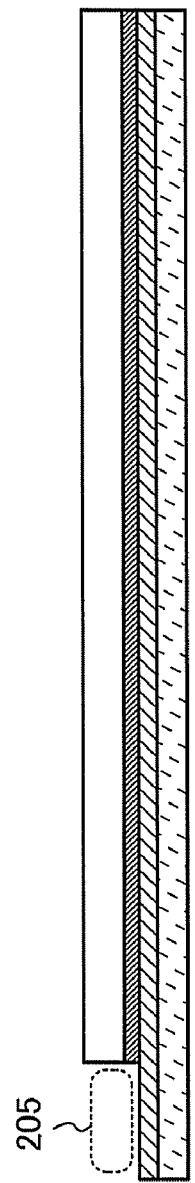

Next, a region 205 of the holding substrate 201 is removed using a scriber or the like (see FIG. 2C). A scriber is an apparatus used to divide a substrate by forming a narrow groove (a scribed groove) and then by making an impact on the scribed groove and causing a crack along the scribed groove. In this embodiment, a cut is made in the holding substrate 201, and the region 205 of the holding substrate 201 is lifted; thus, the region 205 is removed. Due to low adhesion of the separation layer 202 and the holding substrate 201, by lifting the region 205 of the holding substrate 201 having the cut, only the region 205 of the holding substrate 201 can be removed while the semiconductor element layer 203 is left remaining.

In removing the region 205 of the holding substrate 201, part of the separation layer 202 may be removed, or the part of the separation layer 202 may be left over the semiconductor element layer 203. By removing the region 205 of the holding substrate 201, a portion of the semiconductor element layer 203 is exposed.

Next, the stack of the strength-retaining layer 204, the semiconductor element layer 203, the separation layer 202, and the holding substrate 201 is disposed such that the strength-retaining layer 204 is in contact with the porous body 102. At that time, the exposed portion of the semiconductor element layer 203 is disposed over the chamfered, rounded corner portion 109 of the porous body 102 and the chamfered, rounded corner portion 106 of the stage 101. Accordingly, a space 211 is provided between the porous body 102 and the stage 101, and the strength-retaining layer 204. In the base 104 including the porous body 102 and the frame body 103, suction is created by the suction unit 108 through the connecting pipe 105. Accordingly, the stack is held by suction over the porous body 102 (see FIG. 3A).

Then, the exposed portion of the semiconductor element layer 203 is pressed down with the jig 107 having the projecting portion 110.

By pressing down the exposed portion of the semiconductor element layer 203, the semiconductor element layer 203 is separated due to low adhesion to the separation layer 202 and the holding substrate 201 provided thereover. Accordingly, the space 212 is provided between the holding substrate 201 and the semiconductor element layer 203 (see FIG. 3B). By applying a downward force to the exposed portion of the semiconductor element layer 203, only the semiconductor element layer 203 can be easily separated with a weak force and the space 212 can be provided.

By being further pressed down with the jig 107, the exposed portion of the semiconductor element layer 203 is curved along the chamfered, rounded corner portion 109 of the porous body 102 and the chamfered, rounded corner portion 106 of the stage 101. Accordingly, the space 212 where the semiconductor element layer 203 is uniformly separated from the separation layer 202 is provided between the semiconductor element layer 203 and the holding substrate 201.

At the time of the above step, by using the jig 107, the semiconductor element layer 203 is curved along the chamfered, rounded corner portion 109 of the porous body 102 and the chamfered, rounded corner portion 106 of the stage 101. However, the curvature radius R of the corner portion 109 and the corner portion 106 is set so as not to damage the semiconductor element layer 203; therefore, the semiconductor element layer 203 can be prevented from being damaged. Note that the value of the curvature radius R is as described above.

Figure 4A:
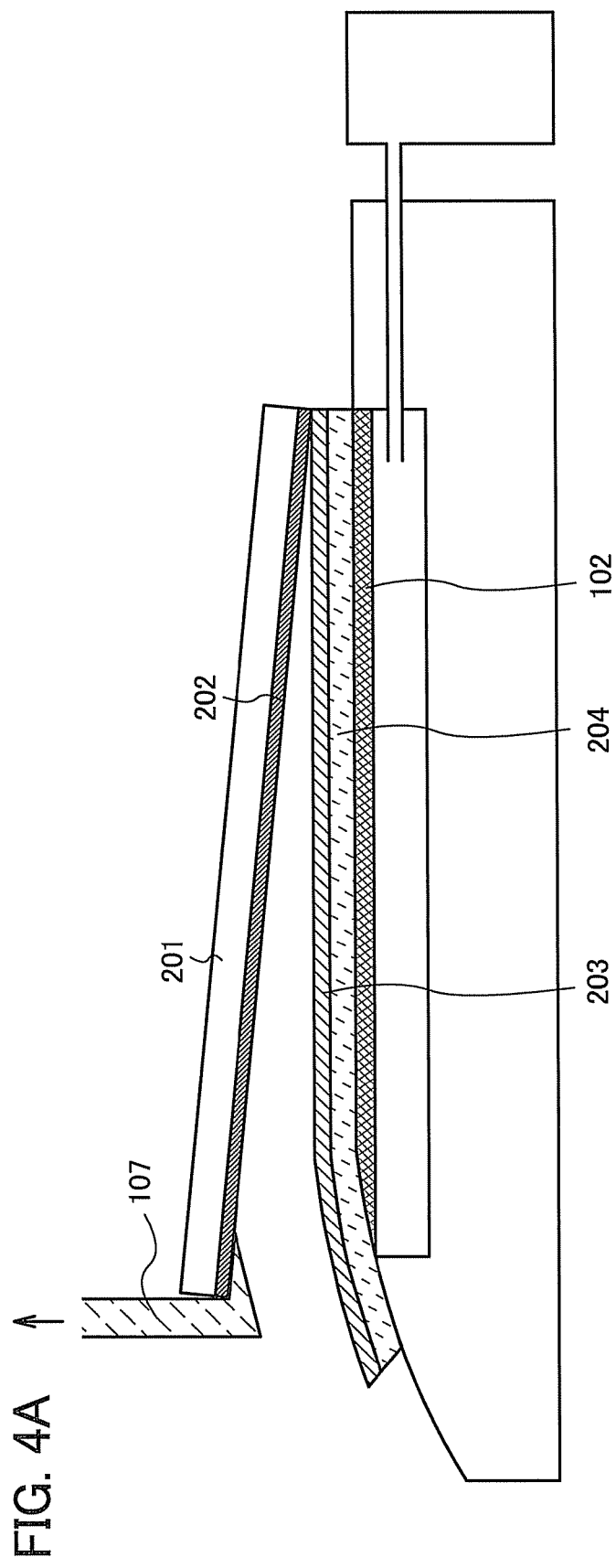
FIGS. 4A and 4B are cross-sectional views illustrating a method for manufacturing a semiconductor element.
Figure 4B:
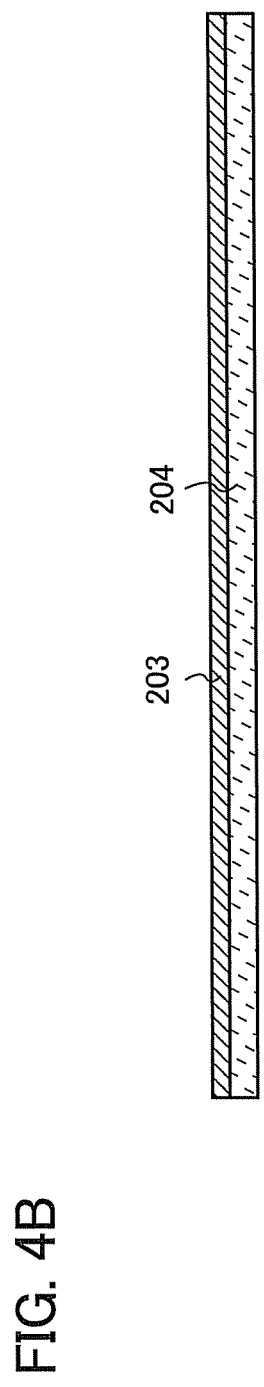

Then, the projecting portion 110 of the jig 107 is inserted in the space 212 such that the projecting portion 110 is in contact with the exposed portion of the semiconductor element layer 203. The jig 107 is lifted in a state where the projecting portion 110 is in contact with the exposed portion of the semiconductor element layer 203. By lifting the jig 107, the holding substrate 201 is lifted. By using the jig 107, the holding substrate 201 is lifted up away from the space 212 where the semiconductor element layer 203 is uniformly separated from the separation layer 202 (see FIG. 4A). At that time, the holding substrate 201 is lifted so as to be curved away from the stage 101. By lifting the holding substrate 201 so as to be curved, a region to be separated per unit time has a linear shape or a band-like shape and can be separated with a weaker force than in the case where a large-area region is separated at a time by vertical lifting. By lifting the holding substrate 201, the holding substrate 201 and the semiconductor element layer 203 are separated from each other through the separation layer 202 (see FIG. 4B and FIG. 6C).

Figure 15A:
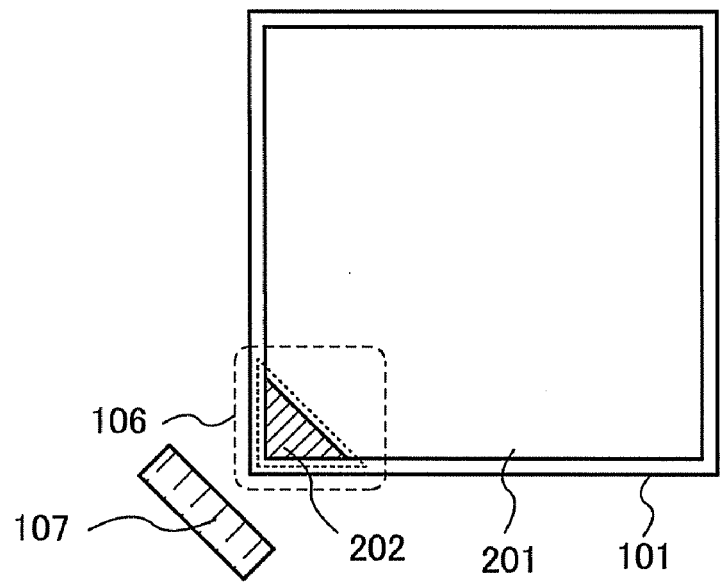
FIGS. 15A and 15B are top views of a separation apparatus.
Figure 15B:
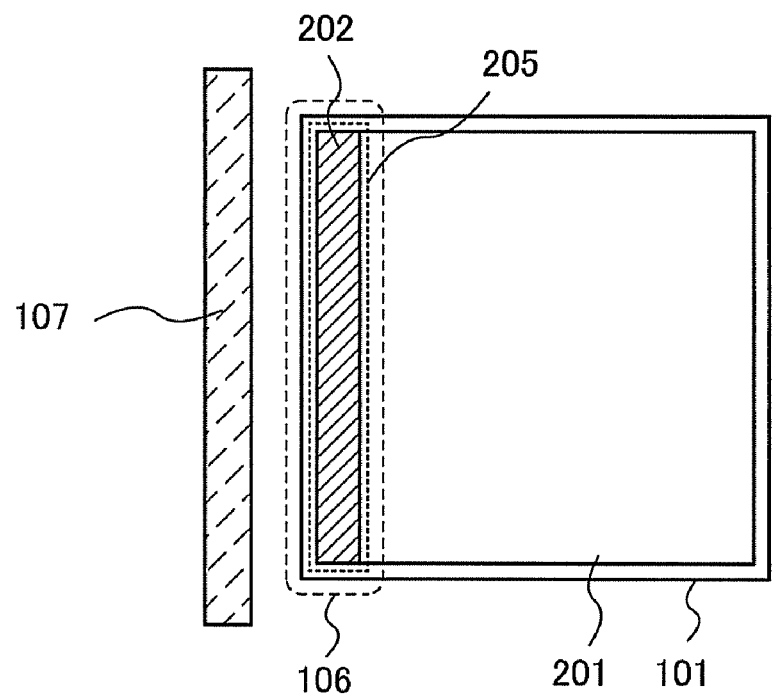

Note that the positional relationship between the jig 107 and the chamfered, rounded corner portion 106 of the stage 101 is illustrated in FIGS. 15A and 15B.

In FIG. 15A, the chamfered, rounded corner portion 106 of the stage 101 is in the vicinity of one corner of the stage 101. The jig 107 is disposed so as to face the longest side of the removed region 205 of the holding substrate 201.

In FIG. 15B, the chamfered, rounded corner portion 106 of the stage 101 is in the vicinity of one side of the stage 101. The jig 107 is disposed so as to face the longest side of the removed region 205 of the holding substrate 201.

A driving apparatus for driving the jig 107 may be provided to automatically drive the jig 107 in the above-described separation process.

Note that a liquid such as water may be applied to the space 212 where the semiconductor element layer 203 is uniformly separated from the separation layer 202. By applying a liquid, electrostatic discharge which occurs at the time of separation can be suppressed, and force needed for separation can be reduced.

As one kind of the liquid, an aqueous solution which has lower resistivity than pure water can be used. In other words, an aqueous solution in which water is a solvent and a solute substance is dissolved in the solvent can be used. The aqueous solution may be acid, alkaline, or neutral. For example, an aqueous solution in which an acid or a base is dissolved, an aqueous solution in which a salt (a salt may be any of an acid salt, an alkaline salt, and a normal salt) is dissolved, or the like can be used. Specific examples of aqueous solutions which can be used as the liquid include an aqueous solution of carbon dioxide ($CO_2$), an aqueous solution of hydrogen chloride (HCl) (a hydrochloric acid), an aqueous solution of tetramethylammonium hydroxide, an aqueous solution of ammonium chloride ($NH_4Cl$), and the like.

As the liquid, it is preferable to use an aqueous solution in which molecules that become gas at normal temperature (25° C.) under atmospheric pressure are dissolved in water, such as an aqueous solution of carbon dioxide or an aqueous solution of hydrogen chloride. This is because the molecules which are dissolved become gas together with water and do not remain when the liquid is dried. In addition, when an aqueous solution in which a salt is dissolved is used, it is preferable to use a salt which functions as a surfactant, because a surface can be easily wetted with the liquid in which the surfactant is dissolved.

Alternatively, a mixed solution of water and a volatile liquid can be used for the liquid. By making the liquid contain a volatile liquid, drying treatment can be omitted. When a volatile liquid contains at least about 0.1% water, electric charge can be diffused by the liquid; that is, an antistatic effect can be obtained. Since some commercially available organic solvents such as high-purity ethanol or acetone contain water as an impurity at a concentration of 0.1% or more, such a commercial organic solvent can be used as a mixed solution of water and a volatile liquid without controlling the concentration. Moreover, in order to utilize an advantage of the volatile liquid, the concentration of the volatile liquid is preferably greater than or equal to 30%. Accordingly, a low-purity organic solvent such as denatured ethanol which is commonly used as an organic solvent can be used as the mixed solution of water and a volatile liquid without controlling the concentration.

One method for supplying liquid is a method in which the liquid is dropped or poured into the space provided by separation, with an injection unit such as a nozzle or a dropper. In that case, the liquid may be supplied constantly from the beginning to the end of separation or may be supplied intermittently. In addition, the liquid may be poured or dropped only at an early stage of separation, in which case the supplied liquid can be spread to the end portion to be separated due to a capillary phenomenon, as separation proceeds.

Another method for supplying the liquid is a method in which the liquid is sprayed in an atomized form with a spray unit such as a spray nozzle or a sprayer. In this method, while the separation proceeds, the liquid may be sprayed constantly, may be sprayed intermittently, or may be sprayed only at an early stage of separation. Note that when pure water is used as the liquid, the liquid in the form of moisture can be sprayed.

Another method for supplying the liquid is a method in which a liquid holding medium that can absorb liquid and release the liquid by application of external force, such as sponge or cloth, is used.

In the separation process of this embodiment, the number of steps can be reduced as compared to a conventional process. In addition, because the number of steps in the separation process can be reduced, manufacturing cost can be reduced.

Figure 6D:
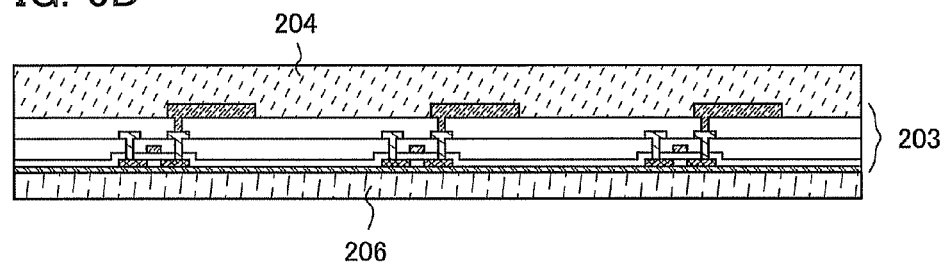
Figure 7A:
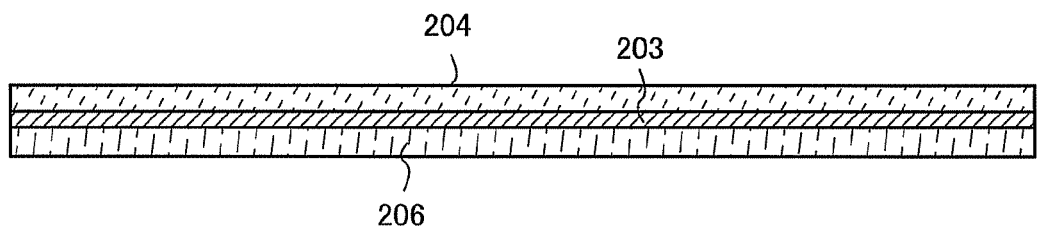
FIGS. 7A and 7B are cross-sectional views illustrating a method for manufacturing a semiconductor element.

Next, a holding substrate 206 which is different from the holding substrate 201 is attached to the semiconductor element layer 203 (see FIG. 7A and FIG. 6D). As the holding substrate 206, a light-transmitting substrate such as a glass substrate, a quartz substrate, or a light-transmitting resin substrate can be used. Alternatively, as the holding substrate 206, a non-light-transmitting substrate such as a non-light-transmitting resin substrate, a semiconductor substrate, a ceramic substrate, or a metal substrate can be used. The light-transmitting substrate or the non-light-transmitting substrate may be a flexible substrate. The holding substrate 206 may be selected from the above-described substrates, depending on the application of the semiconductor element layer 203. In this embodiment, a light-transmitting flexible substrate, more specifically a light-transmitting plastic substrate, is used as the holding substrate 206.

Figure 6E:
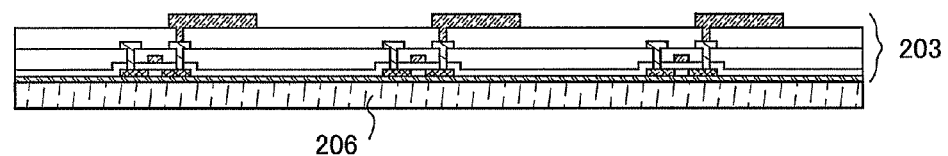
Figure 7B:
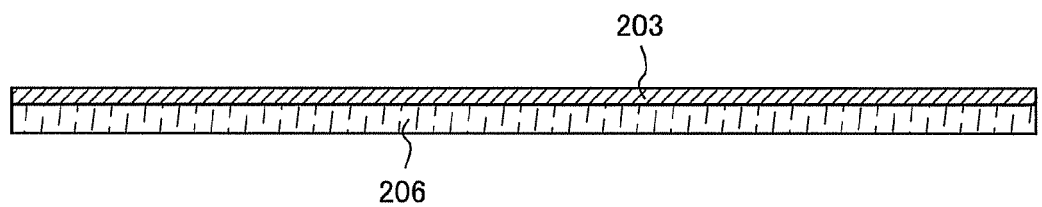

Then, the strength-retaining layer 204 is separated from the semiconductor element layer 203 (see FIG. 7B and FIG. 6E).

In the case where a UV (ultraviolet) detachable film is used as the strength-retaining layer 204 as described above, the strength-retaining layer 204 is separated from the semiconductor element layer 203 by being irradiated with UV (ultraviolet) light. In the case where a water-soluble resin is used as the strength-retaining layer 204, the strength-retaining layer 204 is separated by being washed with water.

Through the above steps, the semiconductor element layer 203 provided over the holding substrate 206 can be obtained.

In the method for manufacturing semiconductor elements of this embodiment, the number of manufacturing steps can be reduced as compared to a conventional method. In addition, because the number of manufacturing steps can be reduced as compared to a conventional method, manufacturing cost can be reduced. Furthermore, productivity in manufacturing semiconductor elements can be improved.

Modified Example 1 of Separation Apparatus

A separation apparatus, a separation method, and a method for manufacturing semiconductor elements, which are different from those described above, will be described below.

Figure 8:
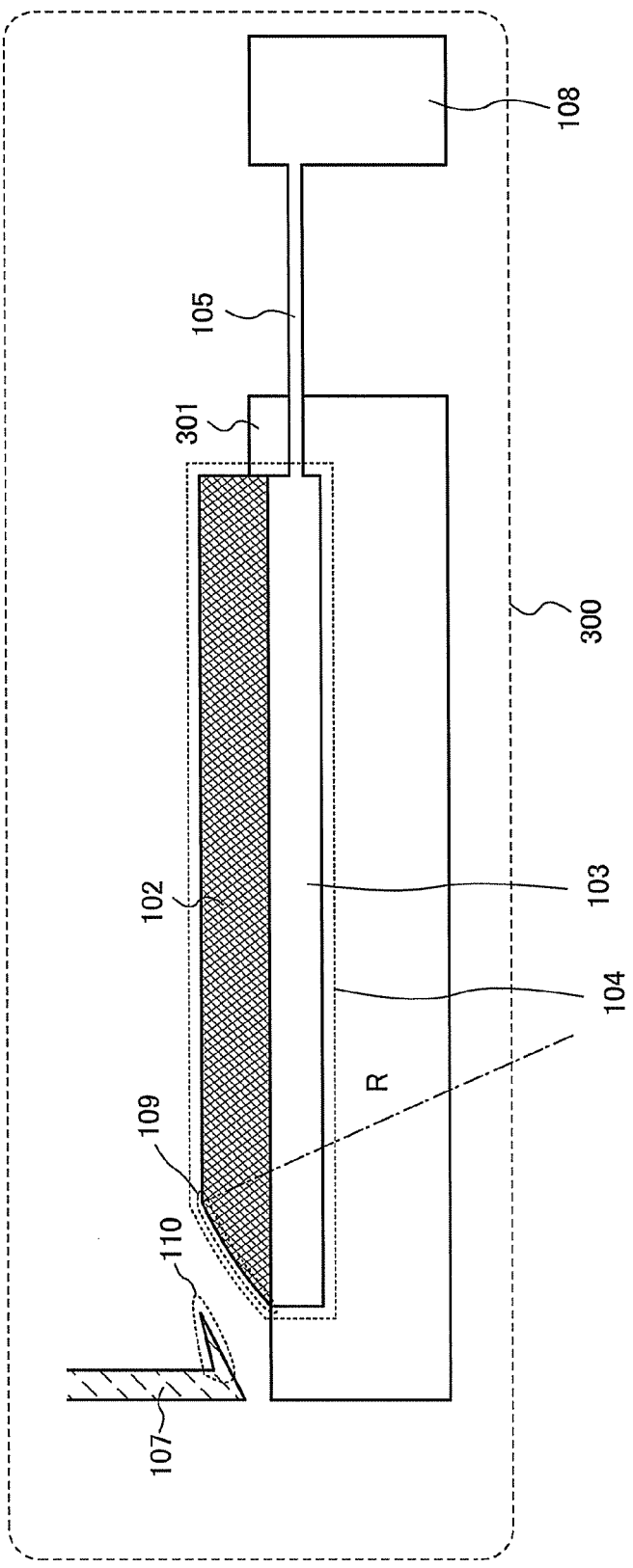
FIG. 8 is a cross-sectional view of a separation apparatus.

FIG. 8 is a diagram illustrating a structure of a separation apparatus 300 of this embodiment. The separation apparatus 300 includes a stage 301, a jig 107 having a projecting portion 110, and a suction unit 108. The stage 301 is provided with a base 104 which includes a porous body 102 having a chamfered, rounded corner portion 109 and a frame body 103 surrounding the porous body 102. The porous body 102 is provided over the frame body 103 and holds an object by suction.

The separation apparatus 300 illustrated in FIG. 8 differs from the separation apparatus 100 illustrated in FIG. 1 in that the corner portion of the stage 301 is flat. In the separation apparatus 300 illustrated in FIG. 8, it is only the porous body 102 that has a chamfered, rounded corner portion.

Figure 20:
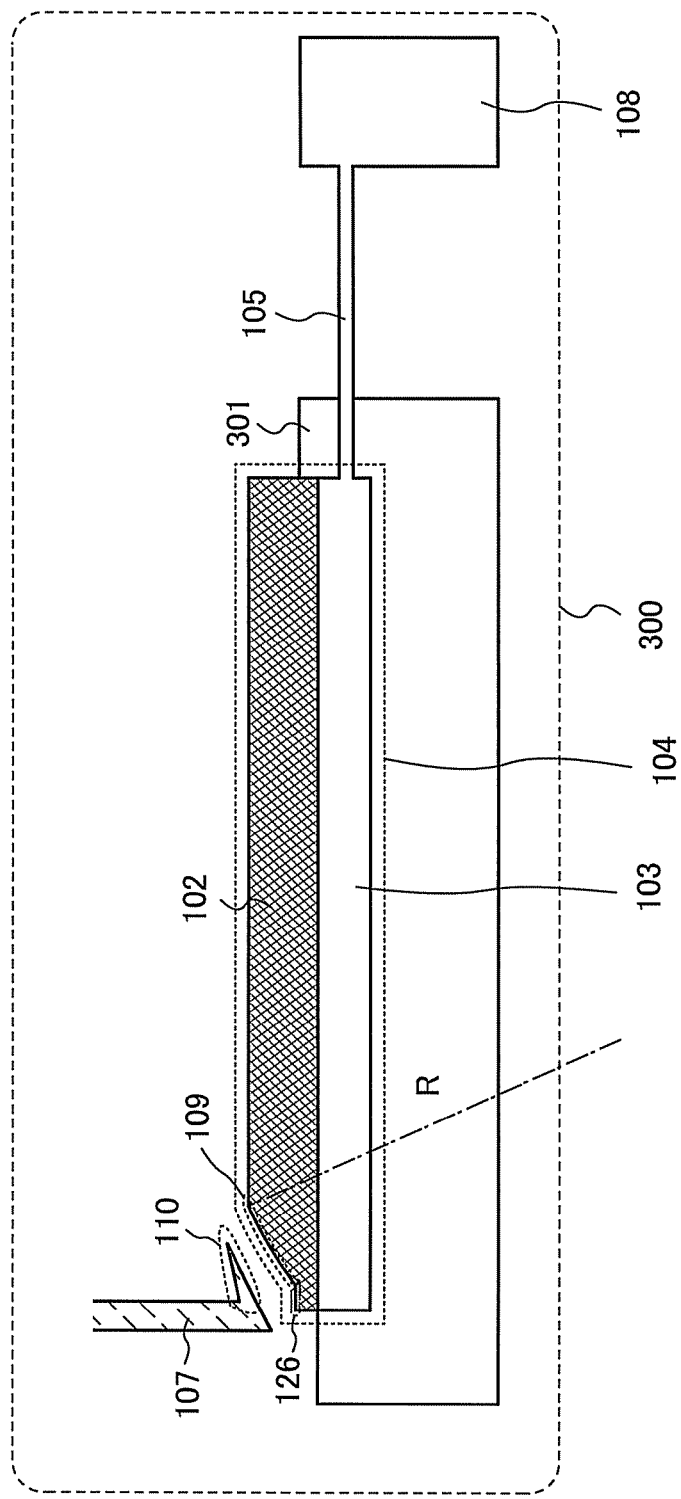
FIG. 20 is a cross-sectional view of a separation apparatus.

Note that in FIG. 8, the chamfered, rounded corner portion 109 is at an end portion of the porous body 102. However, the end portion of the porous body 102 does not necessarily need to be chamfered so as to be rounded. FIG. 20 illustrates an example in which the end portion of the porous body 102 has the chamfered, rounded corner portion 109 and a flat portion 126.

Even in the case where the end portion of the porous body 102 has the flat portion 126, there is no problem with the separation process because the chamfered, rounded corner portion 109 is provided. Due to the presence of the chamfered, rounded corner portion 109, a space 312 is provided between the semiconductor element layer 203 and the holding substrate 201 in the separation process to be described below. It is preferable to provide the chamfered, rounded corner portion 109 because the jig 107 can be inserted in the space 312.

Figure 10:
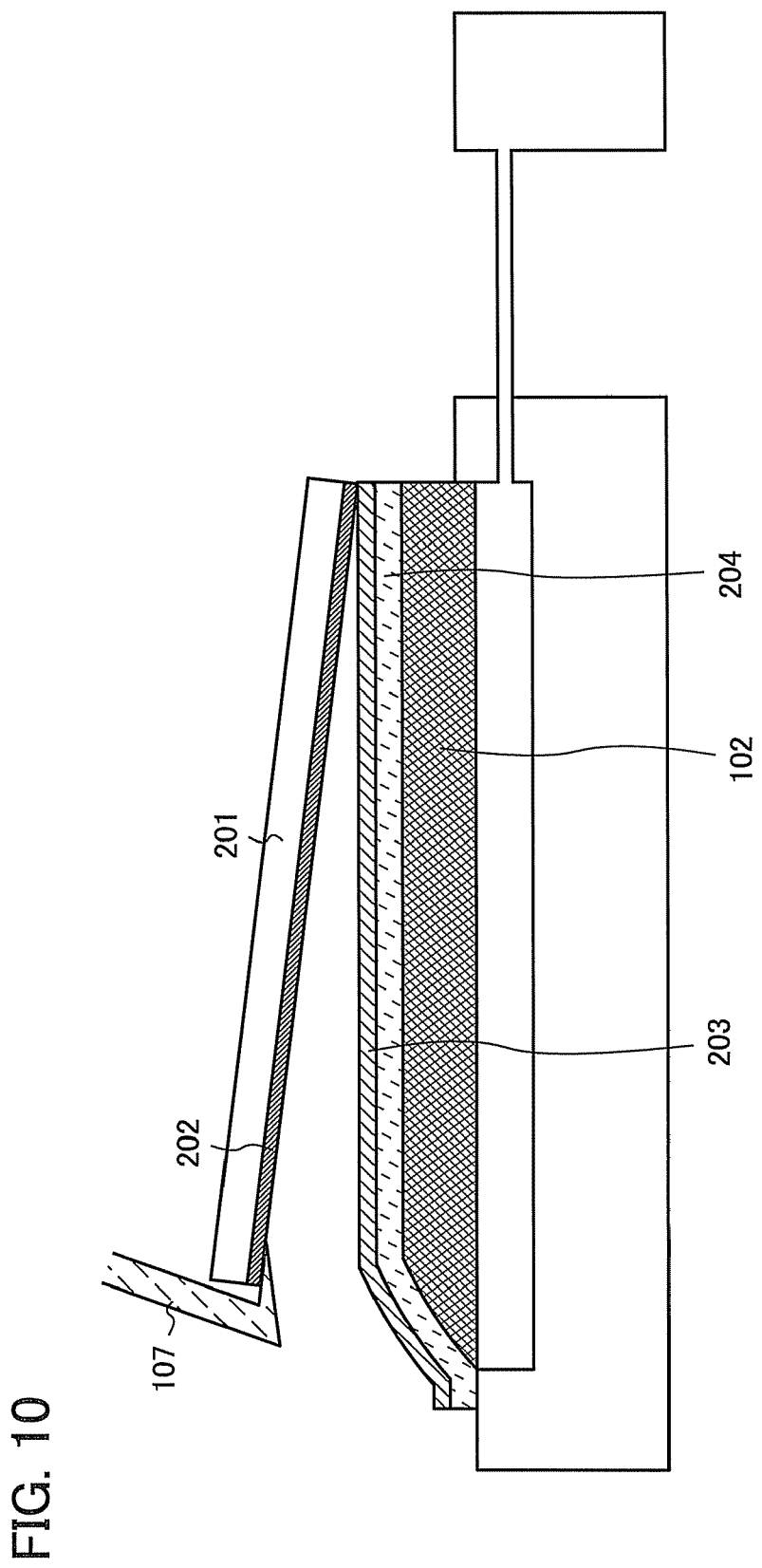
FIG. 10 is a cross-sectional view illustrating a method for manufacturing a semiconductor element.

A separation method and a method for manufacturing a semiconductor element layer illustrated in FIGS. 9A and 9B and FIG. 10 will be described below.

First, steps up to the step of removing the region 205 of the holding substrate 201 as illustrated in FIG. 2C are performed.

Next, the stack of the strength-retaining layer 204, the semiconductor element layer 203, the separation layer 202, and the holding substrate 201 is held by suction over the porous body 102 such that the strength-retaining layer 204 is in contact with the porous body 102. At that time, the exposed portion of the semiconductor element layer 203 is disposed over the chamfered, rounded corner portion 109 of the porous body 102. Accordingly, a space 311 is provided between the porous body 102 and the strength-retaining layer 204 (see FIG. 9A).

Next, by using the jig 107 having the projecting portion 110, the exposed portion of the semiconductor element layer 203 is curved along the chamfered, rounded corner portion 109 of the porous body 102. Accordingly, the space 312 is provided between the holding substrate 201 and the semiconductor element layer 203 (see FIG. 9B).

Figure 21:
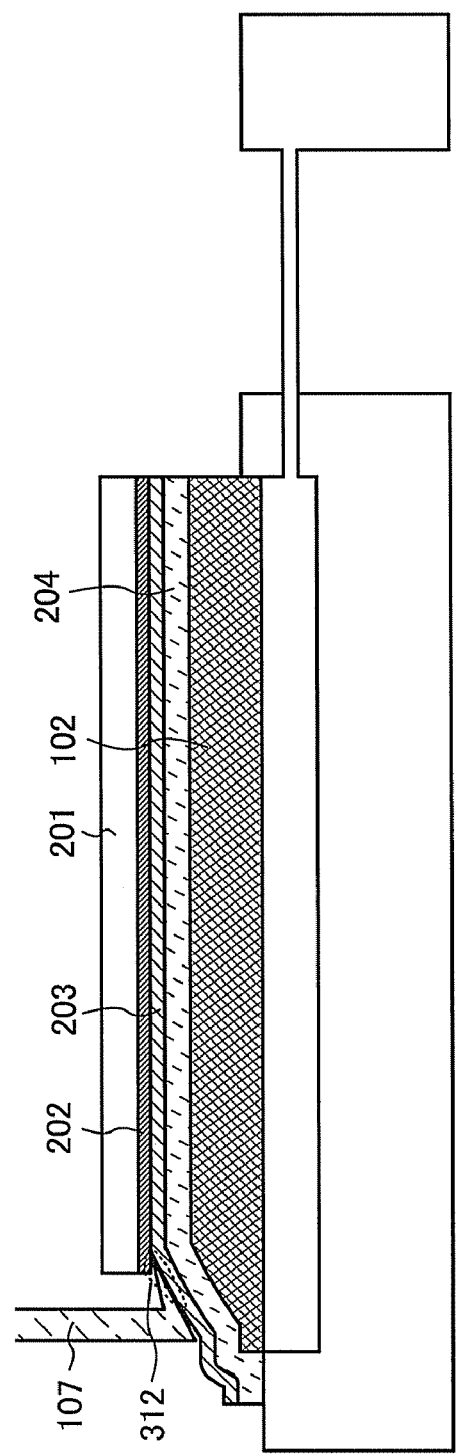
FIG. 21 is a cross-sectional view of a separation apparatus.

Note that in the case where the end portion of the porous body 102 has the chamfered, rounded corner portion 109 and the flat portion 126 (see FIG. 20), the strength-retaining layer 204 and the semiconductor element layer 203 may be disposed along the flat portion 126 (see FIG. 21).

Then, the projecting portion 110 of the jig 107 is inserted in the space 312 such that the projecting portion 110 is in contact with the exposed portion of the semiconductor element layer 203. The jig 107 is lifted in a state where the projecting portion 110 is in contact with the exposed portion of the semiconductor element layer 203. By lifting the jig 107, the holding substrate 201 is lifted (see FIG. 10). By lifting the holding substrate 201, the holding substrate 201 and the semiconductor element layer 203 are separated from each other through the separation layer 202.

By using the separation apparatus of this embodiment, in the separation method and the method for manufacturing semiconductor elements, the number of manufacturing steps can be reduced as compared to a conventional method. In addition, because the number of manufacturing steps can be reduced as compared to conventional methods, manufacturing cost can be reduced. Furthermore, productivity in manufacturing semiconductor elements can be improved.

Modified Example 2 of Separation Apparatus

A separation apparatus, a separation method, and a method for manufacturing semiconductor elements, which are different from those described above, will be described below.

Figure 13:
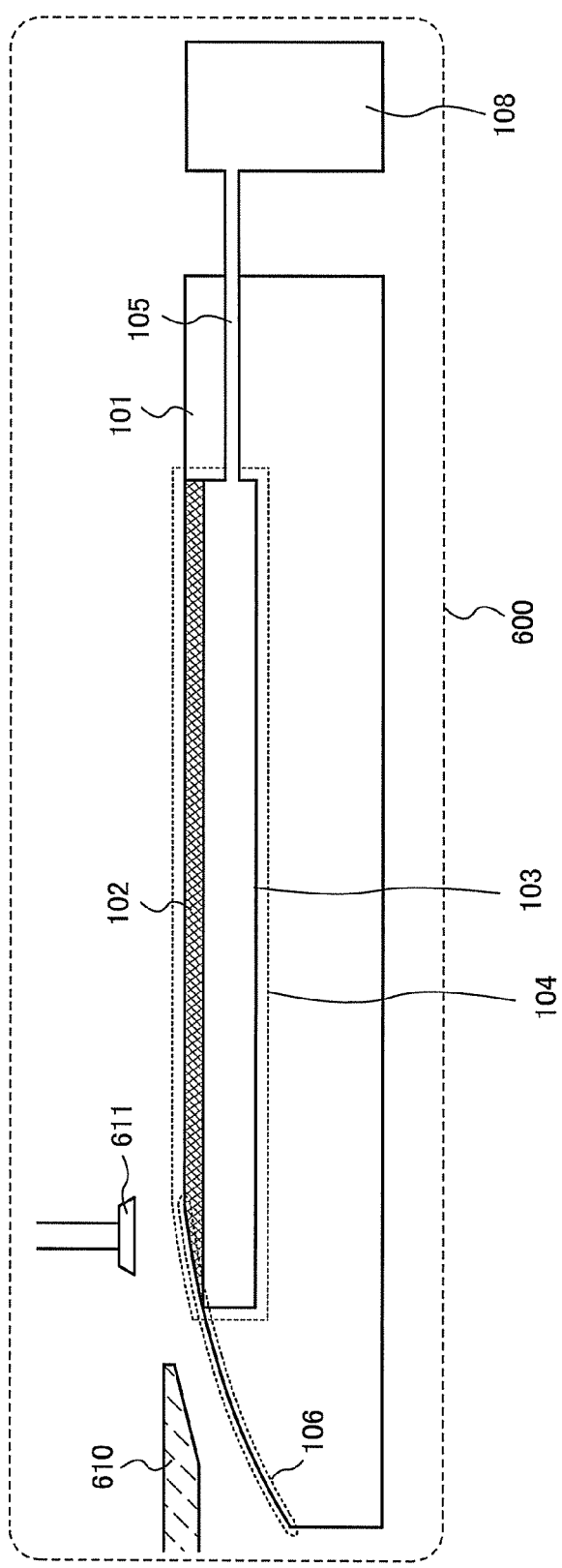
FIG. 13 is a cross-sectional view of a separation apparatus.

FIG. 13 is a diagram illustrating a structure of a separation apparatus 600 of this embodiment. The separation apparatus 600 includes a stage 101 having a chamfered, rounded corner portion 106, a jig 610, a jig 611, and a suction unit 108. The stage 101 is provided with a base 104 which includes a porous body 102 having a chamfered, rounded corner portion 109 and a frame body 103 surrounding the porous body 102. The porous body 102 is provided over the frame body 103 and holds an object by suction. Note that the entire corner portion 106 does not necessarily need to have a uniform curvature radius. The corner portion 106 may have a curvature radius sufficient to provide a space 212 between a semiconductor element layer 203 and a holding substrate 201 by separating the semiconductor element layer 203 from a separation layer 202 and to insert the jig 610 in the space 212 in the separation process described below.

The separation apparatus 600 illustrated in FIG. 13 differs from the separation apparatus 100 illustrated in FIG. 1 in that the jig 107 having the projecting portion 110 is replaced with the jig 610 and the jig 611. The jig 610 is a jig for moving the semiconductor element layer 203 up and down, and the jig 611 is a jig for holding and lifting the holding substrate 201. As the jig 611, a jig having a suction cup at a tip may be used, for example. Note that a driving apparatus for driving the jig 610 and the jig 611 may be provided to automatically drive the jig 610 and the jig 611.

A separation method and a method for manufacturing a semiconductor element layer of this embodiment will be described with reference to FIGS. 14A and 14B.

First, according to the above description, steps up to the step of providing the space 211 between the holding substrate 201 and the semiconductor element layer 203 as illustrated in FIG. 3B are performed.

Next, by using the jig 610 which can be moved up and down, the exposed region of the semiconductor element layer 203 is pressed down to the stage 101 side. By pressing down the exposed region of the semiconductor element layer 203, the semiconductor element layer 203 is separated due to low adhesion to the separation layer 202 and the holding substrate 201 provided thereover.

By applying a downward force to the exposed region of the semiconductor element layer 203, only the semiconductor element layer 203 can be easily separated with a weak force.

By being further pressed down with the jig 610, the semiconductor element layer 203 is curved along the portion of the stage 101 having a curvature radius.

Accordingly, a space 212 where the semiconductor element layer 203 is uniformly separated from the separation layer 202 is provided between the semiconductor element layer 203 and the holding substrate 201 (see FIG. 14A).

The jig 610 is inserted in the space 212, and the holding substrate 201 is lifted up away from the semiconductor element layer 203. By making the suction cup of the jig 611 adhere to the holding substrate 201 and lifting the jig 611, the holding substrate 201 is lifted (see FIG. 14B). By lifting the holding substrate 201, the holding substrate 201 and the semiconductor element layer 203 are separated from each other through the separation layer 202.

Note that a driving apparatus for driving the jig 610 and the jig 611 may be provided to automatically drive the jig 610 and the jig 611 in the above-described separation process.

By using the separation apparatus of this embodiment, in the separation method and the method for manufacturing semiconductor elements, the number of manufacturing steps can be reduced as compared to a conventional method. In addition, because the number of manufacturing steps can be reduced as compared to a conventional method, manufacturing cost can be reduced. Furthermore, productivity in manufacturing semiconductor elements can be improved.

Modified Example 3 of Separation Apparatus

A separation apparatus, a separation method, and a method for manufacturing semiconductor elements, which are different from those described above, will be described below.

FIG. 16A is a diagram illustrating a separation apparatus 700 of this embodiment. Note that FIG. 16B is a top view of a stage 701. The separation apparatus 700 includes a stage 701 having a chamfered, rounded corner portion 706, a jig 107 having a projecting portion 110, and a suction unit 108. The stage 701 is provided with suction holes 702 for holding an object by suction.

The stage 701 is connected to a connecting pipe 705, and the connecting pipe 705 is connected to the suction unit 108. The suction unit 108 creates suction in the stage 701 through the connecting pipe 705. Thus, an object over the stage 701 is held by suction.

Although the jig 107 is provided in FIG. 16A as in FIG. 1, the jig 107 may be replaced with the jig 610 and the jig 611 illustrated in FIG. 13. A driving apparatus for driving the jig 107 or each of the jig 610 and the jig 611 may be provided to automatically drive the jig.

Figure 22:
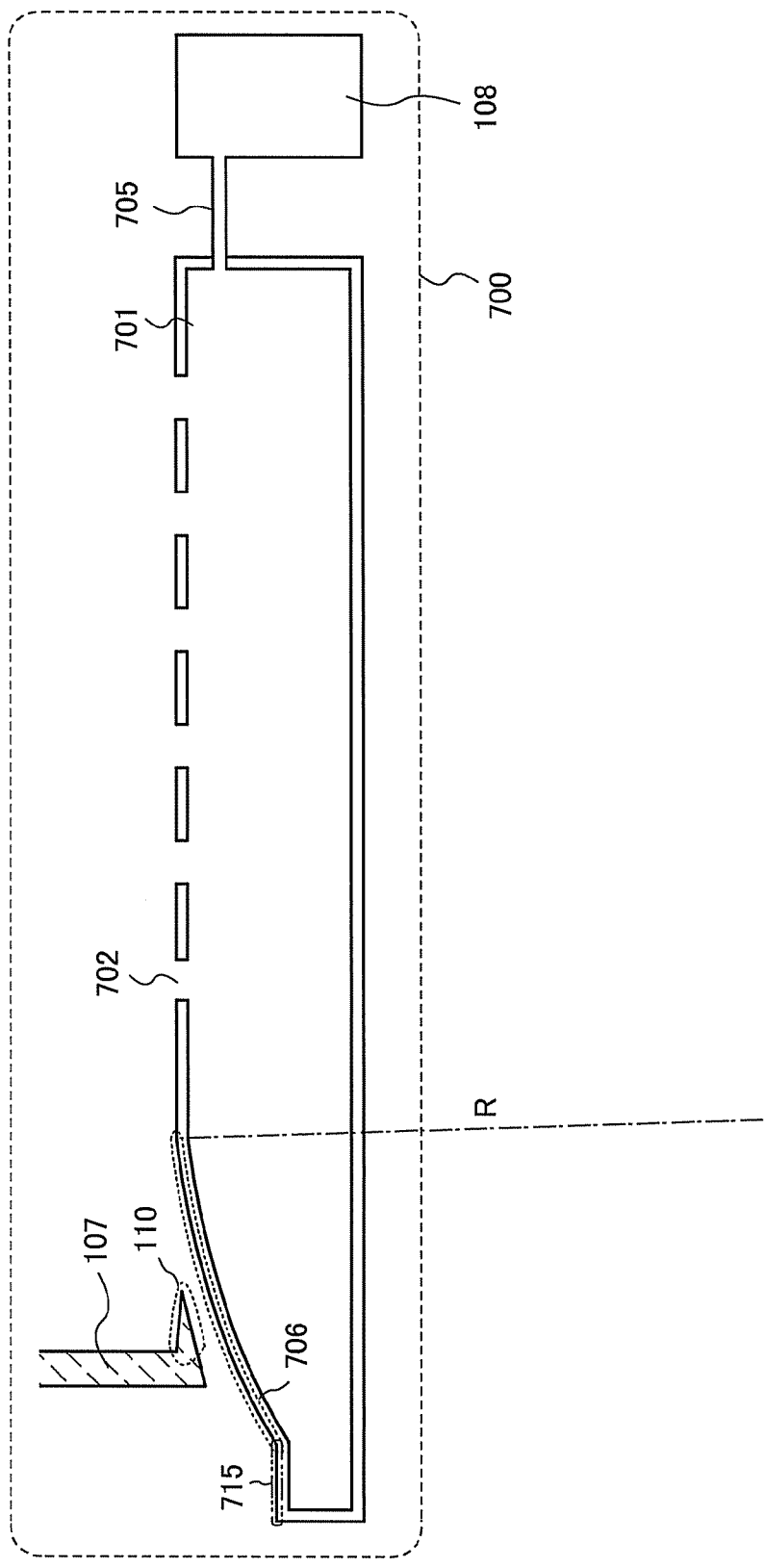
FIG. 22 is a cross-sectional view of a separation apparatus.

Note that in FIG. 16A, the chamfered, rounded corner portion 706 is at an end portion of the stage 701. However, the end portion of the stage 701 does not necessarily need to be chamfered so as to be rounded. FIG. 22 illustrates an example in which an end portion of the stage 701 has the chamfered, rounded corner portion 706 and a flat portion 715.

Even in the case where the end portion of the stage 701 has the flat portion 715, there is no problem with the separation process because the chamfered, rounded corner portion 706 is provided. Due to the presence of the chamfered, rounded corner portion 706, a space 712 is provided between the semiconductor element layer 203 and the holding substrate 201 in the separation process to be described below. It is preferable to provide the chamfered, rounded corner portion 706 because the jig 107 can be inserted in the space 712.

A separation method and a method for manufacturing a semiconductor element layer of this embodiment will be described with reference to FIGS. 17A and 17B and FIG. 18.

First, according to Embodiment 1, steps up to the step of removing the region 205 of the holding substrate 201 as illustrated in FIG. 2C are performed.

Next, the stack of the strength-retaining layer 204, the semiconductor element layer 203, the separation layer 202, and the holding substrate 201 is held by suction over the stage 701 such that the strength-retaining layer 204 is in contact with one surface of the stage 701 provided with the suction holes 702. At that time, the exposed portion of the semiconductor element layer 203 is disposed over the chamfered, rounded corner portion 706 of the stage 701. Accordingly, a space 711 is provided between the stage 701 and the strength-retaining layer 204 (see FIG. 17A).

Next, by using the jig 107 having the projecting portion 110, the exposed portion of the semiconductor element layer 203 is curved along the chamfered, rounded corner portion 706 of the stage 701. Accordingly, the space 712 is provided between the holding substrate 201 and the semiconductor element layer 203 (see FIG. 17B).

Then, the projecting portion 110 of the jig 107 is inserted in the space 712 such that the projecting portion 110 is in contact with the exposed portion of the semiconductor element layer 203. The jig 107 is lifted in a state where the projecting portion 110 is in contact with the exposed portion of the semiconductor element layer 203. By lifting the jig 107, the holding substrate 201 is lifted (see FIG. 18). By lifting the holding substrate 201, the holding substrate 201 and the semiconductor element layer 203 are separated from each other through the separation layer 202.

By using the separation apparatus of this embodiment, in the separation method and the method for manufacturing semiconductor elements, the number of manufacturing steps can be reduced as compared to a conventional method. In addition, because the number of manufacturing steps can be reduced as compared to a conventional method, manufacturing cost can be reduced. Furthermore, productivity in manufacturing semiconductor elements can be improved.

This application is based on Japanese Patent Application serial no. 2010-145260 filed with Japan Patent Office on Jun. 25, 2010, the entire contents of which are hereby incorporated by reference.

What is claimed is:

1. A separation method comprising the steps of:
forming a stack of a semiconductor element layer, a separation layer over the semiconductor element layer, and a holding substrate over the separation layer;
exposing a portion of the semiconductor element layer by removing a portion of the holding substrate and a portion of the separation layer;
holding the stack over a porous body having a rounded corner portion by creating suction in the porous body;
curving a part of the semiconductor element layer along the rounded corner portion of the porous body by pressing down the exposed portion of the semiconductor element layer;
providing a space between the semiconductor element layer and the holding substrate by the curving; and
lifting the holding substrate so that separation of the semiconductor element layer and the holding substrate proceeds from the space through the separation layer.

2. The separation method according to claim 1, wherein the porous body comprises one of a ceramic having a porous structure, a metal having a porous structure, and a resin having a porous structure.

3. The separation method according to claim 1, further comprising the step of forming a strength-retaining layer in contact with the semiconductor element layer.

4. The separation method according to claim 3, wherein the strength-retaining layer is a UV detachable film or a water-soluble resin.

5. The separation method according to claim 1, wherein a curvature radius of the rounded corner portion is 27.5 cm or more.

6. The separation method according to claim 1, wherein the rounded corner portion has a uniform and continuous curvature radius.

7. A method for manufacturing a semiconductor element, comprising the steps of:
forming a stack of a semiconductor element layer including a thin film transistor, a separation layer over the semiconductor element layer, and a holding substrate over the separation layer;
exposing a portion of the semiconductor element layer by removing a portion of the holding substrate and a portion of the separation layer;
holding the stack over a porous body having a rounded corner portion by creating suction in the porous body;
curving a part of the semiconductor element layer along the rounded corner portion of the porous body by pressing down the exposed portion of the semiconductor element layer;
providing a space between the semiconductor element layer and the holding substrate by the curving; and
lifting the holding substrate so that separation of the semiconductor element layer and the holding substrate proceeds from the space through the separation layer.

8. The method for manufacturing a semiconductor element according to claim 7, wherein the porous body comprises one of a ceramic having a porous structure, a metal having a porous structure, and a resin having a porous structure.

9. The method for manufacturing a semiconductor element according to claim 7, further comprising the step of forming a strength-retaining layer in contact with the semiconductor element layer.

10. The method for manufacturing a semiconductor element according to claim 9, wherein the strength-retaining layer is a UV detachable film or a water-soluble resin.

11. The method for manufacturing a semiconductor element according to claim 7, wherein a curvature radius of the rounded corner portion is 27.5 cm or more.

12. The method for manufacturing a semiconductor element according to claim 7, wherein the rounded corner portion has a uniform and continuous curvature radius.

13. A separation method comprising the steps of:
forming a stack of a semiconductor element layer, a separation layer over the semiconductor element layer, and a holding substrate over the separation layer;
exposing a portion of the semiconductor element layer by removing a portion of the holding substrate and a portion of the separation layer;
holding the stack over a stage having a rounded corner portion by creating suction in the stage;
curving a part of the semiconductor element layer along the rounded corner portion of the stage by pressing down the exposed portion of the semiconductor element layer;
providing a space between the semiconductor element layer and the holding substrate by the curving; and
lifting the holding substrate so that separation of the semiconductor element layer and the holding substrate proceeds from the space through the separation layer.

14. The separation method according to claim 13, further comprising the step of forming a strength-retaining layer in contact with the semiconductor element layer.

15. The separation method according to claim 14, wherein the strength-retaining layer is a UV detachable film or a water-soluble resin.

16. The separation method according to claim 13, wherein a curvature radius of the rounded corner portion is 27.5 cm or more.

17. The separation method according to claim 13, wherein the rounded corner portion has a uniform and continuous curvature radius.

18. A method for manufacturing a semiconductor element, comprising the steps of:
forming a stack of a semiconductor element layer including a thin film transistor, a separation layer over the semiconductor element layer, and a holding substrate over the separation layer;
exposing a portion of the semiconductor element layer by removing a portion of the holding substrate and a portion of the separation layer;
holding the stack over a stage having a rounded corner portion by creating suction in the stage;
curving a part of the semiconductor element layer along the rounded corner portion of the stage by pressing down the exposed portion of the semiconductor element layer;
providing a space between the semiconductor element layer and the holding substrate by the curving; and
lifting the holding substrate so that separation of the semiconductor element layer and the holding substrate proceeds from the space through the separation layer.

19. The method for manufacturing a semiconductor element according to claim 18, further comprising the step of forming a strength-retaining layer in contact with the semiconductor element layer.

20. The method for manufacturing a semiconductor element according to claim 19, wherein the strength-retaining layer is a UV detachable film or a water-soluble resin.

21. The method for manufacturing a semiconductor element according to claim 18, wherein a curvature radius of the rounded corner portion is 27.5 cm or more.

22. The method for manufacturing a semiconductor element according to claim 18, wherein the rounded corner portion has a uniform and continuous curvature radius.

* * * * *